US010267506B2

(12) United States Patent
Tudorica et al.

(10) Patent No.: US 10,267,506 B2
(45) Date of Patent: Apr. 23, 2019

(54) SOLID STATE LIGHTING APPARATUSES WITH NON-UNIFORMLY SPACED EMITTERS FOR IMPROVED HEAT DISTRIBUTION, SYSTEM HAVING THE SAME, AND METHODS HAVING THE SAME

(71) Applicant: Cree, Inc., Durham, NC (US)

(72) Inventors: Florin A. Tudorica, Chapel Hill, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 246 days.

(21) Appl. No.: 14/961,470

(22) Filed: Dec. 7, 2015

(65) Prior Publication Data

US 2016/0161098 A1    Jun. 9, 2016

Related U.S. Application Data

(63) Continuation-in-part of application No. 14/019,257, filed on Sep. 5, 2013, now abandoned, and a
(Continued)

(51) Int. Cl.
*H01L 27/15* (2006.01)
*H05B 33/08* (2006.01)
(Continued)

(52) U.S. Cl.
CPC ............ *F21V 29/10* (2015.01); *H01L 27/156* (2013.01); *H01L 33/60* (2013.01); *H01L 33/62* (2013.01);
(Continued)

(58) Field of Classification Search
CPC ... H01L 25/0753; H01L 25/156; H01L 33/62; H01L 27/156; H05B 33/0824;
(Continued)

(56) References Cited

U.S. PATENT DOCUMENTS

| 4,946,547 A | 8/1990 | Palmour |
| 5,200,022 A | 4/1993 | Kong |

(Continued)

FOREIGN PATENT DOCUMENTS

| CN | 1436374 A | 8/2003 |
| CN | 101794855 | 8/2010 |

(Continued)

OTHER PUBLICATIONS

Chinese Office Action for Chinese patent application No. 2013800183735 dated Jan. 18, 2017.

(Continued)

*Primary Examiner* — Bao Q Truong
*Assistant Examiner* — Steven Y Horikoshi
(74) *Attorney, Agent, or Firm* — Jenkins, Wilson, Taylor & Hunt, P.A.

(57) ABSTRACT

Solid state lighting apparatuses, systems, and related methods for improved heat distribution are described. A solid state lighting apparatus can include a substrate and an array of solid state light emitters of varying power arranged on or over the substrate, wherein a predetermined group of the solid state light emitters includes solid state light emitters non-uniformly spaced apart from one another. A method of providing a solid stare lighting apparatus can include providing a substrate, and mounting an array of solid state light emitters of varying power on or over the substrate such that a predetermined group of the solid state light emitters includes solid state light emitters non-uniformly spaced apart from one another.

21 Claims, 16 Drawing Sheets

Related U.S. Application Data continuation-in-part of application No. 14/169,561, filed on Jan. 31, 2014, now abandoned, which is a continuation-in-part of application No. 14/148,102, filed on Jan. 6, 2014, now Pat. No. 9,209,354, which is a continuation of application No. 13/104,558, filed on May 10, 2011, now Pat. No. 8,624,271, which is a continuation-in-part of application No. 29/379,636, filed on Nov. 22, 2010, now Pat. No. Des. 650,760, and a continuation-in-part of application No. 13/028,972, filed on Feb. 16, 2011, now Pat. No. 8,564,000, application No. 14/961,470, filed on Dec. 7, 2015, which is a continuation-in-part of application No. 14/052,201, filed on Oct. 11, 2013, now Pat. No. 8,994,057, which is a continuation of application No. 13/435,912, filed on Mar. 30, 2012, now Pat. No. 8,575,639, which is a continuation-in-part of application No. 13/028,972, filed on Feb. 16, 2011, now Pat. No. 8,564,000, and a continuation-in-part of application No. 13/104,558, filed on May 10, 2011, now Pat. No. 8,624,271, application No. 14/961,470, filed on Dec. 7, 2015, which is a continuation-in-part of application No. 14/221,839, filed on Mar. 21, 2014, now abandoned.

(60) Provisional application No. 62/088,386, filed on Dec. 5, 2014, provisional application No. 61/416,184, filed on Nov. 22, 2010, provisional application No. 61/948,359, filed on Mar. 5, 2014.

(51) Int. Cl.
| | | |
|---|---|---|
| F21V 29/10 | (2015.01) | |
| H01L 33/62 | (2010.01) | |
| H01L 33/60 | (2010.01) | |
| H01L 25/075 | (2006.01) | |
| H01L 33/50 | (2010.01) | |
| F21Y 105/12 | (2016.01) | |
| F21Y 115/10 | (2016.01) | |

(52) U.S. Cl.
CPC ...... H05B 33/0809 (2013.01); *F21Y 2105/12* (2016.08); *F21Y 2115/10* (2016.08); *H01L 25/0753* (2013.01); *H01L 33/505* (2013.01); *H01L 2224/48137* (2013.01); *H01L 2924/0002* (2013.01); *H01L 2924/00014* (2013.01)

(58) Field of Classification Search
CPC ............ H05B 33/0825; H05B 33/0809; H05B 33/0827; H05B 33/0815; H05B 33/0818; F21V 29/10
See application file for complete search history.

(56) References Cited

U.S. PATENT DOCUMENTS

| | | |
|---|---|---|
| RE34,861 E | 2/1995 | Davis |
| 5,493,393 A | 2/1996 | Beranek et al. |
| 6,600,175 B1 | 7/2003 | Baretz et al. |
| 6,661,081 B2 | 12/2003 | Miyaki et al. |
| 6,674,159 B1 | 1/2004 | Peterson et al. |
| 6,795,461 B1 | 9/2004 | Blair et al. |
| 6,874,910 B2 | 4/2005 | Sugimoto et al. |
| 7,329,942 B2 | 2/2008 | Tsou et al. |
| 7,391,046 B2 | 6/2008 | Tsutsumi et al. |
| 7,592,638 B2 | 9/2009 | Kim |
| 7,648,775 B2 | 1/2010 | Wakako et al. |
| 7,714,334 B2 | 5/2010 | Lin |
| 7,791,061 B2 | 9/2010 | Edmond et al. |
| D626,666 S | 11/2010 | Yamamoto et al. |
| D627,493 S | 11/2010 | Yamamoto et al. |
| D628,312 S | 11/2010 | Yamamoto et al. |
| D628,318 S | 11/2010 | Yamamoto et al. |
| 7,825,422 B2 | 11/2010 | Maeda et al. |
| D628,722 S | 12/2010 | Yamamoto et al. |
| 7,927,901 B2 | 4/2011 | Fang et al. |
| D640,997 S | 7/2011 | Imai et al. |
| 7,989,840 B2 | 8/2011 | Sanpei et al. |
| 8,018,135 B2 | 9/2011 | Van de Ven et al. |
| 8,058,088 B2 | 11/2011 | Cannon |
| 8,115,369 B2 | 2/2012 | Kang et al. |
| 8,167,674 B2 | 5/2012 | Hussell et al. |
| 8,188,687 B2 | 5/2012 | Lee et al. |
| 8,304,660 B2 | 11/2012 | Tuan et al. |
| 8,408,748 B2 | 4/2013 | Janik et al. |
| 8,410,679 B2 | 4/2013 | Ibbetson et al. |
| 8,415,693 B2 | 4/2013 | Inobe et al. |
| 8,425,271 B2 | 4/2013 | Hussell et al. |
| 8,456,739 B2 | 6/2013 | Stuettler et al. |
| 8,476,836 B2 | 7/2013 | Van de Ven et al. |
| 8,508,140 B2 | 8/2013 | Leung et al. |
| 8,563,339 B2 | 10/2013 | Tarsa et al. |
| 8,564,000 B2 | 10/2013 | Hussell et al. |
| 8,575,639 B2 | 11/2013 | Hussell |
| 8,624,271 B2 | 1/2014 | Reiherzer et al. |
| 8,629,476 B2 | 1/2014 | Inoguchi |
| D699,387 S | 2/2014 | Snell et al. |
| 8,643,271 B2 | 2/2014 | Shimonishi et al. |
| D700,737 S | 3/2014 | Campagna |
| D702,653 S | 4/2014 | Wilcox et al. |
| 8,692,281 B2 | 4/2014 | Su et al. |
| 8,704,446 B2 | 4/2014 | Gibbs |
| D705,181 S | 5/2014 | Hussell et al. |
| 8,766,313 B2 | 7/2014 | Kashitani et al. |
| D714,989 S | 10/2014 | Rowlette, Jr. |
| 8,895,998 B2 | 11/2014 | Hussell et al. |
| 8,940,561 B2 | 1/2015 | Donofrio et al. |
| D724,550 S | 3/2015 | Song |
| D724,552 S | 3/2015 | Lai et al. |
| 8,975,821 B2 | 3/2015 | Gershowitz et al. |
| 9,024,349 B2 | 5/2015 | Chitnis et al. |
| 9,024,350 B2 | 5/2015 | Loh |
| D732,487 S | 6/2015 | Lai et al. |
| D732,488 S | 6/2015 | Lai et al. |
| D736,725 S | 8/2015 | Wilcox et al. |
| D738,542 S | 9/2015 | Hussell et al. |
| 9,131,561 B2 | 9/2015 | Athalye |
| D741,538 S | 10/2015 | Ghasabi |
| 9,159,888 B2 | 10/2015 | Chitnis et al. |
| 9,172,012 B2 | 10/2015 | Andrews et al. |
| 9,277,605 B2 | 3/2016 | Ni |
| 9,538,590 B2 | 1/2017 | Hussell et al. |
| 9,786,825 B2 | 10/2017 | Hussell |
| 9,806,246 B2 | 10/2017 | Hussell |
| 9,826,581 B2 | 11/2017 | Johnson et al. |
| 2001/0002139 A1 | 5/2001 | Hiraoka |
| 2002/0047189 A1 | 4/2002 | Yoshinori et al. |
| 2002/0048177 A1* | 4/2002 | Rahm .................. H01L 25/0753 362/555 |
| 2003/0189830 A1 | 10/2003 | Sugimoto et al. |
| 2004/0027761 A1 | 2/2004 | Fukui et al. |
| 2005/0002818 A1 | 1/2005 | Ichikawa et al. |
| 2005/0012457 A1* | 1/2005 | Wu ..................... H01L 25/0753 313/512 |
| 2005/0140270 A1* | 6/2005 | Henson ..................... F21K 9/00 313/501 |
| 2006/0147746 A1 | 7/2006 | Wakako et al. |
| 2006/0186418 A1 | 8/2006 | Edmond |
| 2006/0261357 A1 | 11/2006 | Tsou et al. |
| 2007/0029664 A1 | 2/2007 | Mohammed et al. |
| 2007/0062433 A1 | 3/2007 | Hurwitz |
| 2007/0114514 A1 | 5/2007 | Ito |
| 2007/0158668 A1 | 7/2007 | Tarsa |
| 2007/0241362 A1 | 10/2007 | Han et al. |
| 2007/0252523 A1 | 11/2007 | Maeda et al. |
| 2008/0043444 A1 | 2/2008 | Hasegawa et al. |
| 2008/0055901 A1 | 3/2008 | Sanpei et al. |
| 2008/0173884 A1 | 7/2008 | Chitnis et al. |
| 2008/0179611 A1 | 7/2008 | Chitnis et al. |

(56) References Cited

U.S. PATENT DOCUMENTS

| | | | |
|---|---|---|---|
| 2008/0211421 A1 | 9/2008 | Lee et al. | |
| 2008/0258130 A1 | 10/2008 | Bergmann | |
| 2009/0045428 A1 | 2/2009 | Lin | |
| 2009/0153022 A1* | 6/2009 | Hussell | H01L 33/50 313/503 |
| 2009/0184616 A1 | 7/2009 | Van de Ven et al. | |
| 2009/0206718 A1 | 8/2009 | Shimonishi et al. | |
| 2009/0262516 A1 | 10/2009 | Li | |
| 2010/0015742 A1 | 1/2010 | Fang et al. | |
| 2010/0078669 A1 | 4/2010 | Cho et al. | |
| 2010/0090239 A1 | 4/2010 | Lin et al. | |
| 2010/0102345 A1 | 4/2010 | Kong et al. | |
| 2010/0133554 A1 | 6/2010 | Hussell | |
| 2010/0155763 A1 | 6/2010 | Donofrio et al. | |
| 2010/0155766 A1 | 6/2010 | Ku | |
| 2010/0193822 A1 | 8/2010 | Inobe et al. | |
| 2010/0212942 A1 | 8/2010 | Tuan et al. | |
| 2010/0277069 A1 | 11/2010 | Janik et al. | |
| 2010/0289426 A1* | 11/2010 | Takasaka | H05B 33/0818 315/250 |
| 2010/0295464 A1* | 11/2010 | Kasakura | H01L 25/0753 315/287 |
| 2011/0001162 A1 | 1/2011 | Nakayama et al. | |
| 2011/0089465 A1 | 4/2011 | Lin et al. | |
| 2011/0111537 A1 | 5/2011 | Cheng et al. | |
| 2011/0170289 A1 | 7/2011 | Allen et al. | |
| 2011/0193109 A1 | 8/2011 | Loh | |
| 2011/0204409 A1 | 8/2011 | Sung et al. | |
| 2011/0260200 A1 | 10/2011 | Chen | |
| 2011/0267732 A1 | 11/2011 | Kuo | |
| 2011/0305021 A1* | 12/2011 | Xin | H01L 25/0753 362/249.02 |
| 2012/0032226 A1 | 2/2012 | Su et al. | |
| 2012/0038285 A1 | 2/2012 | Leung et al. | |
| 2012/0177909 A1 | 7/2012 | Uchino et al. | |
| 2012/0193649 A1 | 8/2012 | Donofrio | |
| 2012/0193662 A1 | 8/2012 | Donofrio | |
| 2012/0217885 A1 | 8/2012 | Lee | |
| 2012/0250310 A1 | 10/2012 | Hussell et al. | |
| 2012/0299022 A1 | 11/2012 | Hussell | |
| 2012/0313135 A1 | 12/2012 | Kashitani et al. | |
| 2013/0003375 A1 | 1/2013 | Hussell | |
| 2013/0069536 A1 | 3/2013 | Ni | |
| 2013/0200406 A1 | 8/2013 | Hussell | |
| 2013/0200420 A1 | 8/2013 | Hussell | |
| 2013/0214674 A1 | 8/2013 | Inoguchi | |
| 2013/0256710 A1 | 10/2013 | Andrews et al. | |
| 2013/0258658 A1 | 10/2013 | Hussell | |
| 2013/0320868 A1* | 12/2013 | Kim | H05B 33/0824 315/186 |
| 2014/0063818 A1 | 3/2014 | Randolph | |
| 2014/0168981 A1 | 6/2014 | VanStiphout et al. | |
| 2014/0232288 A1 | 8/2014 | Brandes et al. | |
| 2014/0232289 A1* | 8/2014 | Brandes | H05B 33/083 315/250 |
| 2014/0355274 A1 | 12/2014 | Santiago et al. | |
| 2015/0131301 A1 | 5/2015 | Ho | |
| 2015/0257211 A1 | 9/2015 | Johnson et al. | |
| 2015/0282260 A1 | 10/2015 | Hussell et al. | |
| 2016/0165680 A1 | 6/2016 | Johnson et al. | |
| 2016/0255687 A1* | 9/2016 | Zhang | H05B 33/0818 315/210 |

FOREIGN PATENT DOCUMENTS

| | | | |
|---|---|---|---|
| CN | 104247061 A | 12/2014 | |
| CN | 2013800183735 | 2/2018 | |
| JP | H06291236 A | 10/1994 | |
| JP | 2001 131517 A | 5/2001 | |
| JP | 2010 199167 A | 9/2010 | |
| JP | 2012 089551 A | 5/2012 | |
| JP | 5459623 B2 | 4/2014 | |
| KR | 10 0505838 | 10/2005 | |
| KR | 20 2008 0002564 U | 7/2008 | |
| KR | 20 2011 0008161 U | 8/2011 | |
| KR | 10 2011 0104336 | 9/2011 | |
| WO | WO 2011/105409 | 9/2011 | |
| WO | WO 2012/109225 A1 | 8/2012 | |
| WO | WO 2013/148573 | 10/2013 | |
| WO | WO 2014/093813 A1 | 6/2014 | |
| WO | WO 2015/142537 A1 | 9/2015 | |

OTHER PUBLICATIONS

"DuPont Ti-Pure titanium dioxide, Titanium Dioxide for Coatings," Jan. 2012, pp. 1-28, DuPont, USA.
"Technical Guide, Reflectance Materials and Coatings," Jan. 2012, pp. 1-26, Labsphere, USA.
"Thick-Film Ceramic Substrates Design Guide," Mar. 2012, pp. 1-16, CoorsTek, Colorado, USA.
Non-Final Office Action for U.S. Appl. No. 13/435,912 dated Jan. 11, 2013.
Notice of Allowance for U.S. Appl. No. 13/435,912 dated Jun. 19, 2013.
International Search Report and Written Opininon for Application No. PCT/US2013/033704 dated Jun. 26, 2013.
Restriction Requirement for U.S. Appl. No. 13/436,247 dated Aug. 1, 2013.
Non-Final Office Action for U.S. Appl. No. 13/436,247 dated Nov. 7, 2013.
Abandoned U.S. Appl. No. 29/484,053, filed Mar. 5, 2014.
International Search Report and Written Opininon for Application No. PCT/US2013/074998 dated Apr. 3, 2014.
Restriction Requirement for U.S. Appl. No. 13/836,940 dated Jun. 17, 2014.
Notice of Allowance for U.S. Appl. No. 13/436,247 dated Jun. 18, 2014.
Non-Final Office Action for U.S. Appl. No. 13/836,709 dated Sep. 30, 2014.
Non-Final Office Action for U.S. Appl. No. 13/836,940 dated Oct. 7, 2014.
Restriction Requirement for U.S. Appl. No. 29/452,692 dated Dec. 4, 2014.
International Search Report for Application No. PCT/US 2015/018964, dated Jan. 9, 2015.
Final Office Action for U.S. Appl. No. 13/836,709 dated Apr. 9, 2015.
Notice of Allowance for U.S. Appl. No. 29/452,692 dated Apr. 13, 2015.
Final Office Action forU.S. Appl. No. 13/836,940 dated Apr. 17, 2015.
Restriction Requirement for U.S. Appl. No. 13/367,929 dated May 11, 2015.
Advisory Action for U.S. Appl. No. 13/836,709 dated Jun. 23, 2015.
Notice of Allowance for U.S. Appl. No. 29/452,692 dated Jul. 24, 2015.
Notice of Allowance for U.S. Appl. No. 29/452,692 dated Aug. 7, 2015.
Restriction Requirement for U.S. Appl. No. 14/639,743 dated Sep. 4, 2015.
Non-Final Office Action for U.S. Appl. No. 13/836,940 dated Sep. 11, 2015.
Restriction Requirement for U.S. Appl. No. 29/484,056 dated Nov. 10, 2015.
Non-Final Office Action for U.S. Appl. No. 13/836,709 dated Sep. 11, 2015.
Non-Final Office Action for U.S. Appl. No. 14/639,743 dated Dec. 31, 2015.
Restriction Requirement for U.S. Appl. No. 29/484,053 dated Jan. 15, 2016.
Final Office Action for U.S. Appl. No. 13/836,709 dated Feb. 12, 2016.
Final Office Action for U.S. Appl. No. 13/836,940 dated Feb. 12, 2016.
Chinese Office Action for Chinese patent application No. 201380065403 dated Dec. 9, 2016.

(56) References Cited

OTHER PUBLICATIONS

Final Office Action for U.S. Appl. No. 13/836,709 dated Jan. 23, 2017.
Final Office Action for U.S. Appl. No. 13/836,940 dated Jan. 23, 2017.
Notice of Allowance for U.S. Appl. No. 14/961,439 dated Mar. 30, 2017.
Notice of Issuance for Chinese Application No. 201380018373 dated Nov. 13, 2017.
Restriction Requirement for U.S. Appl. No. 13/836,709 dated Jun. 19, 2014.
Notice of Allowance for U.S. Appl. No. 13/836,940 dated May 18, 2017.
Notice of Allowance for U.S. Appl. No. 13/836,709 dated Jun. 29, 2017.
Chinese Office Action for Application No. 2013800183735 dated Jul. 12, 2017.
Notice of Allowance for U.S. Appl. No. 14/961,439 dated Jul. 18, 2017.
Notice of Allowance for U.S. Appl. No. 13/836,940 dated Jul. 18, 2017.
Supplemental Notice of Allowance for U.S. Appl. No. 13/836,709 dated Jul. 31, 2017.
Chinese Office Action for Application No. 2013800183735 dated May 18, 2016.
Notice of Publication for U.S. Appl. No. 14/961,439 dated Jun. 9, 2016.
Non-Final Office Action for U.S. Appl. No. 13/836,709 dated Jul. 7, 2016.
Non-Final Office Action for U.S. Appl. No. 13/836,940 dated Jul. 21, 2016.
Non-Final Office Action for U.S. Appl. No. 14/221,839 dated Aug. 10, 2016.
Notice of Allowance for U.S. Appl. No. 14/639,743 dated Aug. 26, 2016.
Notice of Allowability for U.S. Appl. No. 14/639,743 dated Sep. 20, 2016.
Non-Final Office Action for U.S. Appl. No. 14/961,439 dated Sep. 23, 2016.
Non-Final Office Action for U.S. Appl. No. 13/367,929 dated Oct. 7, 2015.
Final Office Action for U.S. Appl. No. 13/367,929 dated May 9, 2016.
Non-Office Action for U.S. Appl. No. 13/367,929 dated Sep. 23, 2016.
Non-Office Action for U.S. Appl. No. 13/367,929 dated Oct. 20, 2017.

\* cited by examiner

SOLID STATE LIGHTING APPARATUSES WITH NON-UNIFORMLY SPACED EMITTERS FOR IMPROVED HEAT DISTRIBUTION, SYSTEM HAVING THE SAME, AND METHODS HAVING THE SAME

CROSS-REFERENCE TO RELATED APPLICATIONS

This application relates and claims priority to U.S. Provisional Patent Application Ser. No. 62/088,386, filed on Dec. 5, 2014. This application relates to and is a continuation-in-part of and claims priority to U.S. patent application Ser. No. 14/019,257, filed on Sep. 5, 2013. This application also relates to and is a continuation-in-part of and claims priority to U.S. patent application Ser. No. 14/168,561, filed on Jan. 30, 2014, which is a continuation-in-part of U.S. patent application Ser. No. 14/148,102 filed on Jan. 6, 2014 which claims priority to U.S. patent application Ser. No. 13/104,558 filed May 10, 2011, which relates to and claims priority to U.S. Provisional Patent Application Serial No. 61/416,184, filed Nov. 22, 2010, and is a continuation-in-part of and claims priority to each of U.S. Design patent application Ser. No. 29/379,636, filed Nov. 22, 2010 and U.S. patent application Ser. No. 13/028,972, filed Feb. 16, 2011. This application also relates to and is a continuation-in-part of and claims priority to U.S. patent application Ser. No. 14/052,201, filed Oct. 11, 2013, which is related to and is a continuation of and claims priority to U.S. patent application Ser. No. 13/435,912, filed Mar. 30, 2012, which is related to and is a continuation-in-part of and claims priority to each of U.S. patent application Ser. No. 13/028,972, filed Feb. 16, 2011, and U.S. patent application Ser. No. 13/104,558, filed May 10, 2011. This application relates to and is a continuation-in-part of and claims priority to U.S. Provisional Patent Application Serial No. 61/948,359, filed on Mar. 5, 2014, and is also a continuation-in-part of and claims priority to U.S. patent application Ser. No. 14/221,839, filed Mar. 21, 2014. The disclosures of each of the related applications referenced herein are hereby incorporated by reference in their entireties.

TECHNICAL FIELD

The present subject matter generally relates to solid state lighting apparatuses, systems, and related methods and, more particularly, to solid state lighting apparatuses, systems, and related methods configured for improved heat distribution.

BACKGROUND

Typically, modern methods of reliability testing for chip on board (COB) solid state lighting apparatuses, as well as other types of solid state lighting apparatuses, can cause cracking in the encapsulant disposed over the arrays of solid state light emitters. These cracks often originate from central portions of the LED arrays, where photon flux and temperatures are usually the highest. LED arrays where some solid state light emitters and/or strings are centrally positioned or more dense in a particular region can have increased degradation and even cracking of encapsulant material above or around the array originating from the centralized heat resulting from LED positioning.

Accordingly, a need exists for solid state lighting apparatuses, systems, and related methods for improved heat distribution.

SUMMARY

Solid state lighting apparatuses, systems, and/or related methods with improved heat distribution are disclosed herein. In one aspect, solid stare lighting apparatuses can comprise a substrate and an array of solid state light emitters of varying power arranged on or over the substrate, wherein a predetermined group of the solid state light emitters comprises solid state light emitters non-uniformly spaced apart from one another. In another aspect, methods of providing a solid state light apparatus can comprise providing a substrate and mounting an array of solid state light emitters of varying power on or over the substrate such that a predetermined group of the solid state light emitters comprises solid state light emitters non-uniformly spaced apart from one another. In another aspect, solid state lighting systems can comprise a substrate, an array of solid state light emitters of varying power arranged on or over the substrate, and a light emission area disposed over the substrate and comprising the array of solid state light emitters. In such an aspect, a central portion of the light emission area can have a the density that is lower than a the density of a peripheral portion of the light emission area.

Other aspects, features and embodiments of the subject matter will be more fully apparent from the ensuing disclosure and appended claims. Apparatuses, systems, and/or related methods provided herein can have improved dimming capabilities, improved thermal management capabilities, improved brightness, reduced perceptible flicker, and/or voltage configurable for accommodating/serving multiple different lighting applications. These and other objects can be achieved according to the subject matter herein.

BRIEF DESCRIPTION OF DRAWINGS

A full and enabling disclosure of the present subject matter is set forth more particularly in the remainder of the specification, including reference to the accompanying figures, relating to one or more embodiments, in which.

DETAILED DESCRIPTION

Figure 1:
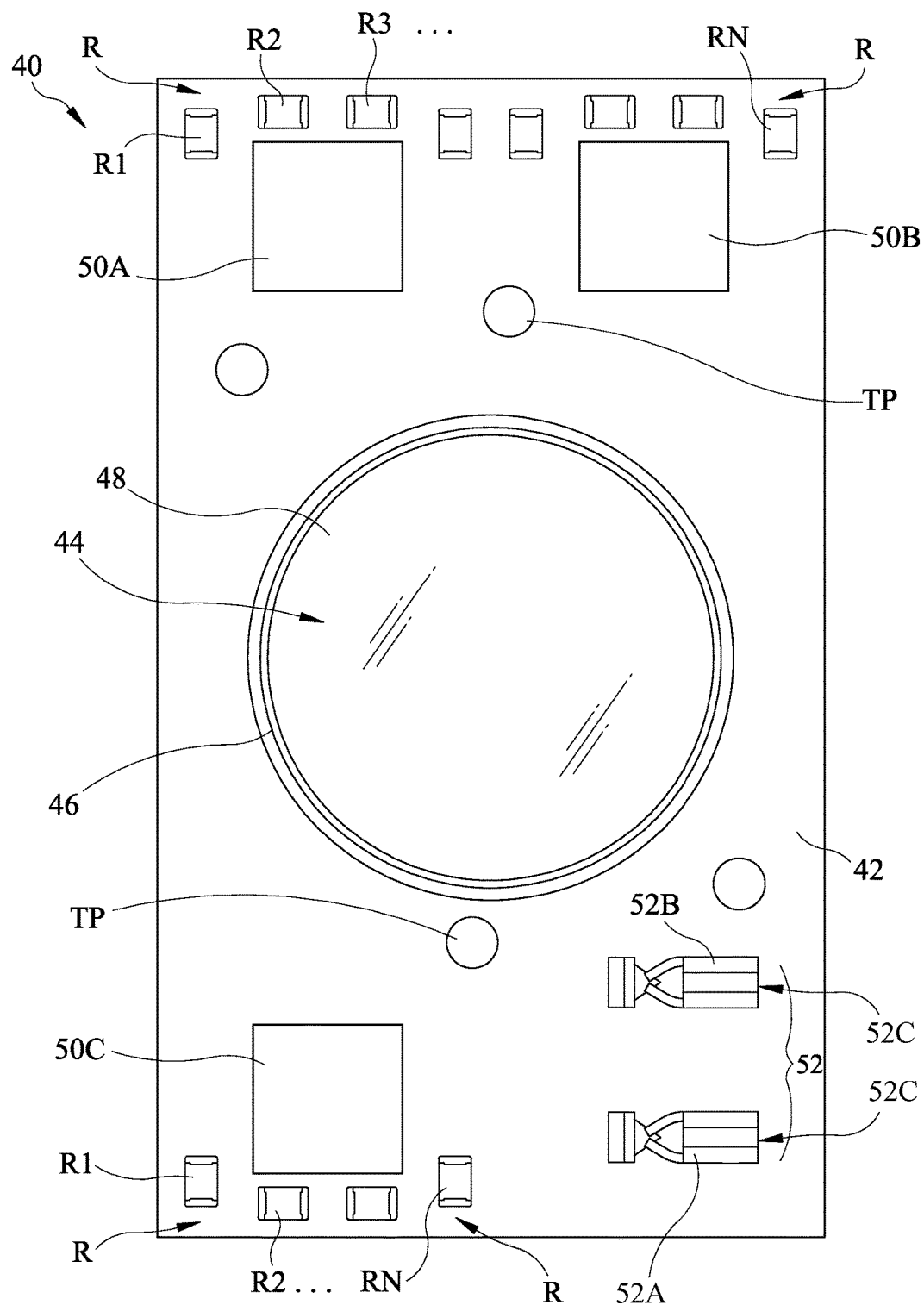
FIG. 1 is a top plan view illustrating an exemplary solid state lighting apparatus according to some aspects of the present subject matter.

The present subject matter relates in certain aspects to solid state lighting apparatuses, systems, and related methods for improved heat distribution. Exemplary solid state lighting apparatuses, systems, and/or related methods can be configured as having a substrate and an array of solid state light emitters (e.g., one or more light emitting device (LED) chips and/or LED strings) spaced either non-uniformly or uniformly. In particular, an array of solid state light emitters can comprise multiple sets, segments, or strings of a plurality of serially connected solid state light emitters arranged on or supported by the substrate. Alternatively, solid state light emitters can be arranged on or supported by a substrate through direct attach. As used herein, "direct attach" is used to describe a solid state light emitter (e.g., solid state light emitter or chips) that includes, without limitation, a solid state light emitter and attachment method as described for example in U.S. Publication Nos. 2012/0193649 and 2012/0193662, both filed on Aug. 2, 2012 and commonly owned herewith, the contents of both of which are incorporated by reference herein in their entireties.

Exemplary solid state lighting apparatuses can further comprise at least one rectified-AC driver configured in series or in parallel to independently operate a predetermined group(s) of single solid state light emitters that are dissipating more power than other solid state light emitters in an array. In either configuration, heat is more uniformly distributed in the solid state lighting apparatuses, systems, and related methods, but the solid state lighting optics are unimpacted. In particular, multiple rectified-AC drivers (e.g., drive circuitry or power chips) can be arranged on or supported by the substrate.

Using this basic architecture at least one predetermined group in the array of the solid state light emitters can result in reduced hot spots. The array of solid state light emitters can either be uniformly spaced apart or non-uniformly spaced apart from one another within a defined light emission area of the apparatus. Where the at least one predetermined group of solid state light emitters dissipates more light and heat than other non-predetermined group(s), the light emitters in the at least one predetermined group can be spaced farther apart from one another than chips in the non-predetermined group(s), can be disposed towards a peripheral portion of the light emission area, and/or can be configured to be activated and/or deactivated at different times relevant to another predetermined group during a portion of an alternating current (AC) cycle via the driving components in order improve heat distribution, while maintaining optical uniformity. Such configurations to improve heat distribution can also be effective even if the at least one predetermined group of solid state light emitters does not dissipate more heat than other non-predetermined groups of solid state light emitters.

In addition, exemplary solid state lighting apparatuses, systems, and/or related methods can comprise a phosphoric filling material disposed over the array of solid state light emitters, wherein a layer of phosphor within the filling material settles or is otherwise proximate to a bottom of the filling material to additionally improve reliability performance by mitigating crack origination.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising," "including," and "having" as used herein should be interpreted as open-ended terms that do not preclude the presence of one or more elements. Like numbers refer to like elements throughout this description.

It is understood that when an element such as a layer, region, or structure is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter" and "emitter" as used herein refer to any device capable of producing visible or near visible (e.g., from infrared to ultraviolet) wavelength radiation, including but not limited to, xenon lamps, mercury lamps, sodium lamps, incandescent lamps, and solid state emitters, including light emitting diodes (LEDs or solid state light emitters), organic light emitting diodes (OLEDs), and lasers.

The terms "solid state light emitter" or "solid state emitter" refer to an LED, a laser diode, an organic LED, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple solid state light emitters are electrically connected in series, in parallel, or in mixed series/parallel configurations among mutually exclusive groups/segments/sets.

The LED or solid state light emitter "segment" further refers to a separately switched portion of a string of solid state light emitters. A segment can include at least one solid state light emitter, which can itself include a number of serially connected epi junctions used to provide a chip that has a particular forward voltage, such as 3V, 6V, 9V, etc., where a single epi junction may have a forward voltage of about 1.5V to 2.7V (e.g., for blue solid state light emitters) or typically 3V at normal current. Each segment can also comprise multiple solid state light emitters that are connected in various parallel and/or serial arrangements. The segments of solid state light emitters can be configured in a number of different ways and may have various compensation circuits associated therewith, as discussed, for example, in commonly assigned and co-pending U.S. patent application Ser. No. 13/235,103 and U.S. patent application Ser. No. 13/235,127, the disclosure of each of which is hereby incorporated by reference herein.

The terms "driver", "LED driver", "drive circuitry", and "power chip" are synonymous and refer to integrated circuit (IC) components or elements adapted to deliver current to solid state light emitters for causing illumination thereof. In some aspects, LED drivers or power chips described herein comprise components available from SUPERTEX, INC.® of Sunnyvale, Calif., which was recently acquired by Microchip Tech.

The term "targeted" refers to configurations of solid state light emitter segments that are configured to provide a pre-defined lighting characteristic that is a specified parameter for the lighting apparatus. For example, a targeted spectral power distribution can be a spectral power distribution that is specified for the light provided by the apparatus as a result of dimming the light. In particular, the targeted spectral power distribution can describe the characteristic of the light that is generated at a particular dimming level. In some aspects, the targeted spectral power distribution can be specified on the packaging of the lighting apparatus or otherwise in conjunction with the advertising or marketing of the lighting apparatus. Furthermore, the targeted spectral power distribution can be associated with the lighting characteristics of two or more specified dimming levels, such as a low light level and a higher light level. Accordingly, the targeted spectral power distribution can be provided as the light shifts from "full on" to more dimming as well a shift in the reverse direction toward "full on".

Apparatuses and segments can comprise multiple LED segments, each configured to emit a different CCT color temperature for improved dimming. Each solid state light emitter within each respective segment can target approximately a same CCT value. For example, and in some aspects, a first segment can be configured to emit light comprising a CCT value targeting approximately 1800K, at least one other segment can be configured to emit slightly cooler light, for example, comprising CCT values targeting approximately 2100K and 2400K, respectively, and at least one other segment can emit slightly cooler light targeting approximately 3000K. When each segment is powered "on", together the segments are collectively configured to emit warm white light that is tuned or targeted to approximately 2700K and/or approximately 3000K. As each segment turns from "on" to "off", light warms from approximately 2700K (e.g., or 3000K) to 1800K as it dims, incandescent-style. Thus, apparatuses and systems herein are configured to emit light that is pleasing to consumers. For example, in some aspects according to the present subject matter, the dimming may be provided using the techniques described in the priority document noted above, U.S. patent application Ser. No. 14/221,839, filed on Mar. 21, 2014, the disclosure of which is incorporated herein by reference in the entirety.

Solid state light emitters can be characterized as having a particular spectral power distribution, which can affect various light characteristics of the light emitted by the chip. A spectral power distribution can be used to express the power per unit area per unit wavelength of an illumination (radiant exitance), or more generally, the per wavelength contribution to any radiometric quantity (such as radiant energy, radiant flux, radiant intensity, radiance, irradiance, radiant exitance, and/or radiosity, etc.). A spectral power distribution can be normalized in some aspects, such as, to unity at 555 or 560 nanometers (nm), coinciding with the peak of the eye's luminosity function.

The term "substrate" as used herein in connection with lighting apparatuses refers to a mounting member or element on which, in which, or over which, multiple solid state light emitters (e.g., LED chips) and/or circuitry components can be arranged, supported, and/or mounted. Exemplary substrates useful with lighting apparatuses as described herein comprise printed circuit boards (including but not limited to metal core printed circuit boards, flexible circuit boards, dielectric laminates, ceramic based substrates, and the like) or ceramic boards having FR4 and/or electrical traces arranged on one or multiple surfaces thereof, support panels, and/or mounting elements of various materials and conformations arranged to receive, support, and/or conduct electrical power to solid state emitters. Electrical traces described herein can be visible and/or covered via a reflective covering, such as a solder mask.

In some aspects, a single, unitary substrate can be used to support multiple groups of solid state light emitters in addition to at least some other circuits and/or circuit elements, such as a power or current driving components. In other aspects, multiple substrates can be used for supporting and/or electrically connecting to the solid state light emitters and power components.

Solid state lighting apparatuses, systems, and/or related methods according to aspects of the subject matter herein can comprise III-V nitride (e.g., gallium nitride) based solid state light emitters or laser chips fabricated on a silicon, silicon carbide, sapphire, or III-V nitride growth substrate, including (for example) chips manufactured and sold by Cree, Inc. of Durham, N.C. Such solid state light emitters and/or lasers can be configured to operate such that light emission occurs through the substrate in a so-called "flip chip" orientation. Such LED and/or laser chips can also be devoid of growth substrates (e.g., following growth substrate removal).

Solid state light emitters useable with lighting apparatuses as disclosed herein can comprise horizontal structures (with both electrical contacts on a same side of the solid state light emitter) and/or vertical structures (with electrical contacts on opposite sides of the solid state light emitter). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit one or more beams to stimulate emissions of one or more lumiphoric materials (e.g., phosphors, scintillators, lumiphoric inks, quantum dots) to generate light at one or more peak wavelengths, or of at least one desired perceived color (e.g., a red, a green, a yellow, a blue, a white color and/or combinations thereof). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces, e.g., so that the materials settle towards a bottom of an emission area. Methods for fabricating solid state light emitters having a planarized coating of phosphor integrated therewith are discussed by way of example in U.S. Patent Application Publication No. 2008/0179611 to Chitnis et al., the disclosure of which is hereby incorporated by reference herein in the entirety.

The term "settled" refers to the lumiphoric materials being more densely concentrated within one or more predetermined portions of the distributed lumiphoric coating. In some aspects, the apparatuses, systems, and/or methods provided herein comprise or have, for example, a lumen density of at least approximately 30 lm/mm$^2$ or more. In some aspects, apparatuses, systems, and/or methods provided herein comprise a lumen density of at least 60 lm/mm$^2$ or more. In some aspects, apparatuses, systems, and/or provided herein comprise a lumen density of at least 90 lm/mm$^2$ or more.

Other materials, such as light scattering elements (e.g., particles) and/or index matching materials can be associated with a lumiphoric material-containing element or surface. Apparatuses and methods as disclosed herein can comprise solid state light emitters of different colors, one or more of which can be white emitting (e.g., including at least one solid state light emitter with one or more lumiphoric materials). In one aspect, the solid state light emitter emits a white light combination of LED and phosphor light. A solid state light emitter can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. In the alternative, solid state light emitters can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. Other suitable methods of coating solid state light emitters are described in U.S. Pat. Nos. 8,167,674, 8,425271 and 8,410,679, each of which are also incorporated herein by reference in the entirety. Notably, solid state light emitters described herein can also be coated with a coating or protective layer having a non-uniform distribution of wavelength conversion material (e.g., phosphors or lumiphors) provided therein. It is understood that solid state lighting apparatuses, systems, and/or methods according to the present subject matter can also have multiple solid state light emitters of different colors, one or more of which may be white emitting.

In other aspects, one or more short wavelength solid state emitters (e.g., blue and/or cyan solid state light emitters) can be used to stimulate emissions from a mixture of lumiphoric materials, or discrete layers of lumiphoric material, including red, yellow, and green lumiphoric materials. Solid state light emitters of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175 and U.S. Patent Application Pub. No. 2009/0184616), are well-known and available to persons of skill in the art.

In other aspects, dimming effects, where the CCT of the light source changes when dimmed, can be achieved by mixing red/orange (RDO), amber, blue shifted yellow (BSY), warm white, and other solid state light emitters or die that produce different colors in a direct drive configuration are provided. In a dim to warm example, solid state light emitters combine to produce a desired end CCT point will be used and connected to a direct drive controller, such as a power chip. In low dimming instances, one string will be the only string active in a direct drive topology. As the other strings turn on, cooler solid state light emitters are used to increase the color temperature. This change in CCT will behave in the opposite manner as the dimming level is decreased. Mixing different color solid state light emitters in different targeted strings will allow for color change while dimming and increase the CCT of the LED source. Aspects of color mixing, segmental switching "on" and "off" during an AC waveform, and dimming according to the present subject matter may be provided using the circuitry and/or techniques described in U.S. patent application Ser. No. 14/221,839, the disclosure of which was previously incorporated hereinabove by reference.

The term "lighting apparatus" or "lighting system" as used herein, is not limited, except that it is capable of emitting light. That is, a lighting apparatus or system can be a device, apparatus, or system that illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, or any other light emitting device.

In some aspects, apparatuses, systems, and/or related methods as described herein are devoid of any AC-to-DC converter in electrical communication between the AC power source and multiple sets (e.g., disposed in an array) of solid state light emitters. In some aspects, lighting apparatuses, systems, and/or related methods as described herein comprises multiple power circuits (e.g., a packaged driving circuit or driving component) for providing voltage configurable components. The at least one power circuit can comprise a current switching circuitry that is packaged or housed within a housing and arranged in electrical communication between an AC power source and multiple sets of solid state light emitters. In some aspects, lighting apparatuses and systems as described herein comprise at least one rectifier bridge (or multiple rectifier bridges in some aspects) arranged in electrical communication between the AC source and multiple sets of solid state light emitters for rectifying the AC signal.

In some aspects, lighting apparatuses, systems, and/or related methods as described herein comprise multiple sets of mutually exclusive solid state light emitters that are configured to be activated and/or deactivated at different times relative to one another during a portion of an AC cycle, and each set of the multiple sets comprises at least a first solid state light emitter segment targeting a first color and at least a second solid state light emitter segment targeting a second color that is different than the first color. In some aspects, each set of the multiple sets comprises at least two solid state light emitters of a same color (e.g., the peak wavelengths coincide). In some aspects, each set of the multiple sets of solid state emitters is adapted lo emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selective activating sets of solid state emitters is according to the present subject matter may be provided using the circuitry and/or techniques described in U.S. patent application Ser. No. 14/221,839, the disclosure of which was previously incorporated hereinabove by reference.

In some aspects, lighting apparatuses, systems, and/or related methods as described herein comprise multiple sets of solid state light emitters that are configured to be activated and/or deactivated at different times relative to one another during a portion of an AC cycle, and the lighting apparatus comprises an output of at least approximately 100 lumens per watt (LPW) or more, at least about 68 LPW or more, at least approximately 130 LPW or more, at least approximately 140 LPW or more, or more than approximately 150 LPW. One or more of the foregoing LPW thresholds are attained for emissions having at least one of a cool white (CW) color temperature or a warm white (WW) color temperature. White emissions of apparatuses and/or systems herein have x, y color coordinates within four, seven, or ten MacAdam step ellipses of a reference point on the blackbody locus of a 1931 CIE Chromaticity Diagram. Apparatuses, systems, and/or related methods described herein can be powered via approximately 10 watts (W) or more.

In some aspects, lighting apparatuses, systems, and/or related methods described herein can emit white light having a reference point on the blackbody locus (e.g., 1931 CIE Chromaticity Diagram) can have a color temperature of less than or approximately equal to 5000 K, less than or approximately equal to 4000 K, less than or approximately equal to 3500 K, less than or approximately equal to 3000 K, or less than or approximately equal to 2700 K. In some aspects, combined emissions from a lighting apparatus as described herein embody a color rendering index (CRI Ra) value of at least 70, at least 75, or at least 80 (e.g., 82 or 85) or more.

In some aspects, apparatuses, systems, and related methods disclosed herein can comprise a closely or tightly packed array of solid state light emitters, where a packing density of the solid state light emitters over a portion of the light emission area can, for example, be between approximately 25% and 50%. Different portions of the light emission area can comprise different packing densities, where, for example, a central portion of the light emission area can be less densely packed than a peripheral portion of the light emission area. The emission area can, for example, comprise a diameter of approximately 6 mm or more, approximately 9 mm or more, or approximately 30 mm or more. Adjacent solid state light emitters can be spaced apart by a distance of at least approximately 50 μm or more. In other aspects, adjacent solid state light emitters can be spaced apart, for example, by a distance of at least approximately 200 μm or more, at least approximately 300 μm or more, at least approximately 400 μm or more, or more than approximately 500 μm. Spacing of the light emitters can differ between different portions of the light emission area. For example, the central portion of the light emission area can comprise at least one predetermined group of solid state light emitters that are spaced apart more than the solid state light emitters in a peripheral portion of the light emission area.

Various illustrative features are described below in connection with the accompanying figures.

FIG. 1 illustrates an embodiment of a solid state light emitting apparatus, generally designated 40. In some aspects, apparatus 40 comprises three or more direct drive components, designated 50A, 50B, and 50C. Direct drive components 50A to 50C can comprise packaged driving devices, such as packaged IC power chips, supported over a substrate 42 for activating and deactivating solid state light emitters (e.g., 56, FIGS. 2-4) during a portion of an alternating current (AC) wave cycle.

A light emission area 44 is also disposed over and supported by substrate 42, and can vary from between approximately 6 mm to more than 35 mm. Emission area 44 can comprise a plurality of solid state light emitters (56, FIGS. 2-4) disposed below a filling material 48. A retention dam or retaining structure 46, which is optionally reflective, is disposed outside of filling material 48. Retaining dam 46 can comprise a reflector or reflective structure. A lens or other structure (not shown) can be disposed over an entirety of light emission area 44. The lens can either be flat or domed.

In some aspects, substrate 42 also supports electrical components or circuitry components, such as one or more resistors, generally designated R. A plurality of resistors R can be provided per apparatus 40, such as individual resistors designated R1 to RN (where N is a whole number integer >1). Resistors R can be disposed about each drive component 50A to 50C for regulating current and/or reducing flicker. A pair of connectors, generally designated 52 are disposed over substrate 42. In some aspects, electrical wires (not shown) are configured to connect to apparatus 40 via connectors 52. Each connector 52A and 52B of the pair of connectors can comprise an outer portion with an opening or wire receiving portion 52C. Electrical current can pass into apparatus 40 when wires physically and/or electrically connect to connectors 52. Optical and electrical properties of apparatus 40 can be tested via connection to one or more test points TP of substrate 42.

In some aspects, filling material 48 is comprised of a silicone encapsulant that is subject to severe thermal loads and/or thermal degradation over time. Specifically, filling material 48 can be susceptible to localized heating and cracking via heat generated at solid state light emitters 56 and heat generated by florescence (e.g., phosphoric) centers dispersed in the encapsulate filling material 48. Such cracking may be accelerated during reliability testing, which is an integral part of the manufacturing process, and tends to originate from a central portion of emission area 44 where photon flux and temperature are the highest. For example, some LED arrays are configured such that at least one predetermined group of chips 56 disposed towards a central portion of emission area 44 can generate more power (or dissipate more power) per chip than other chips 56.

Figure 2:
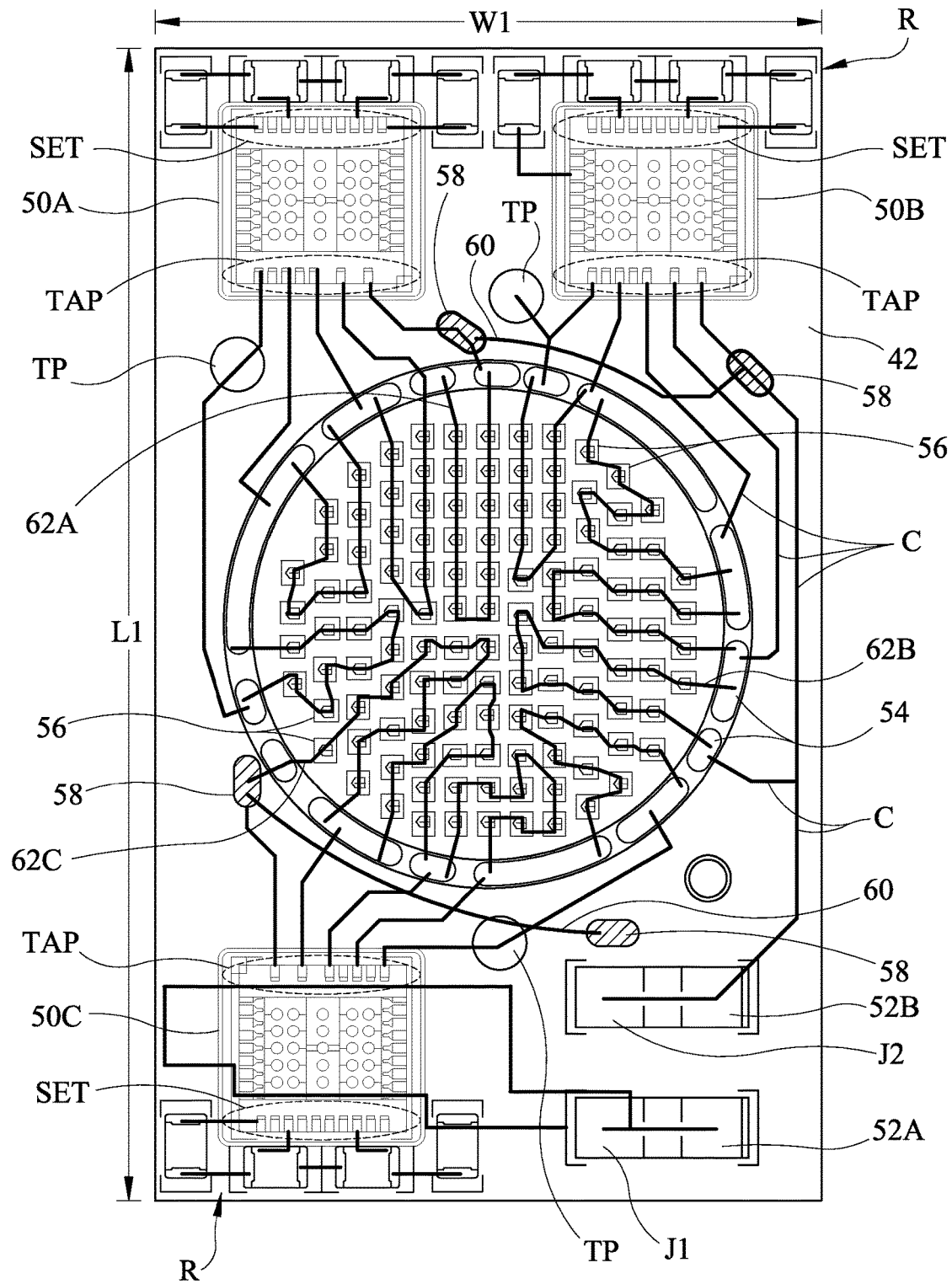
FIGS. 2-4 are top plan views illustrating various exemplary embodiments of a solid state lighting apparatus including multiple solid state light emitters.
Figure 3A:
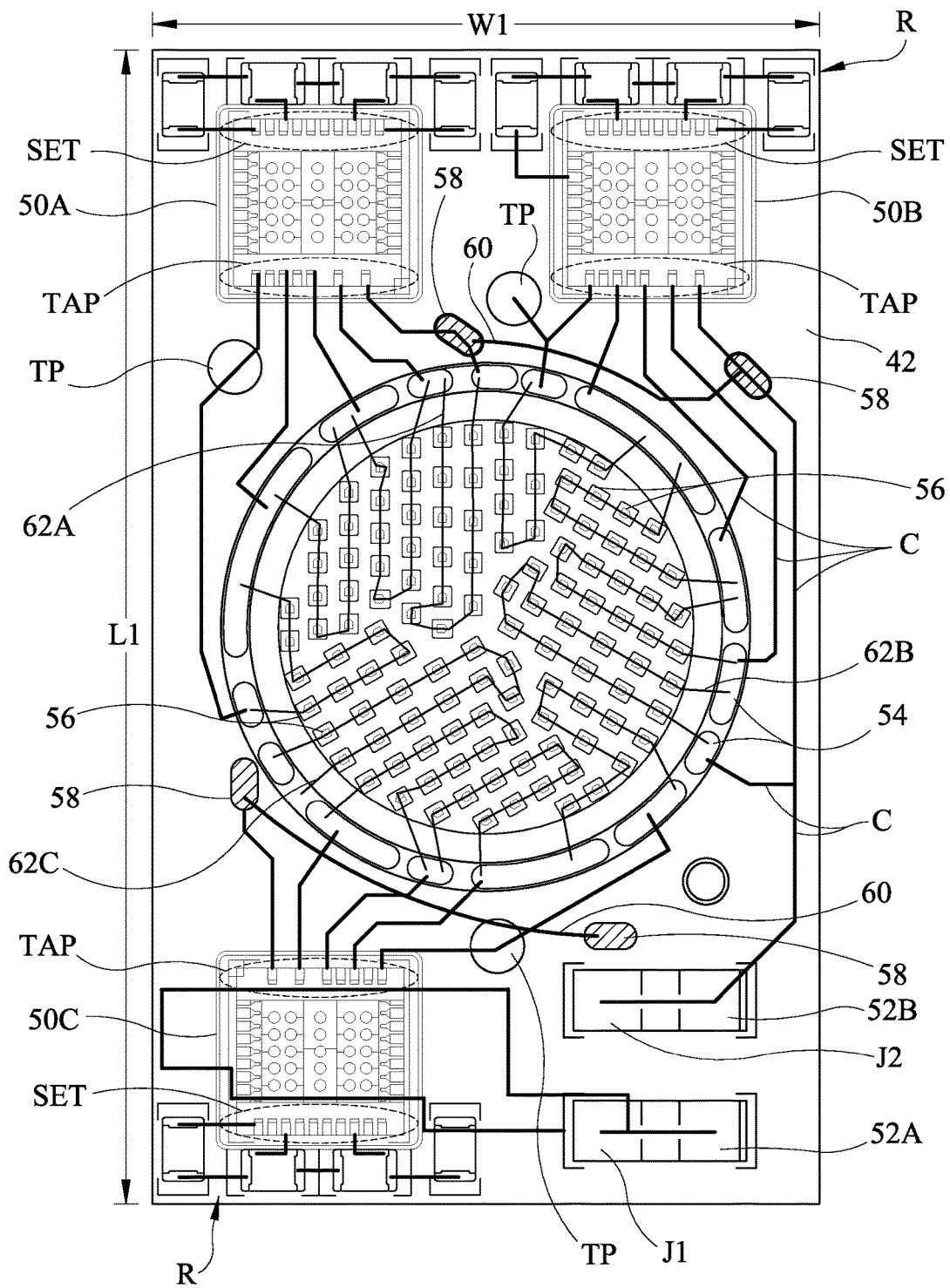
Figure 3B:
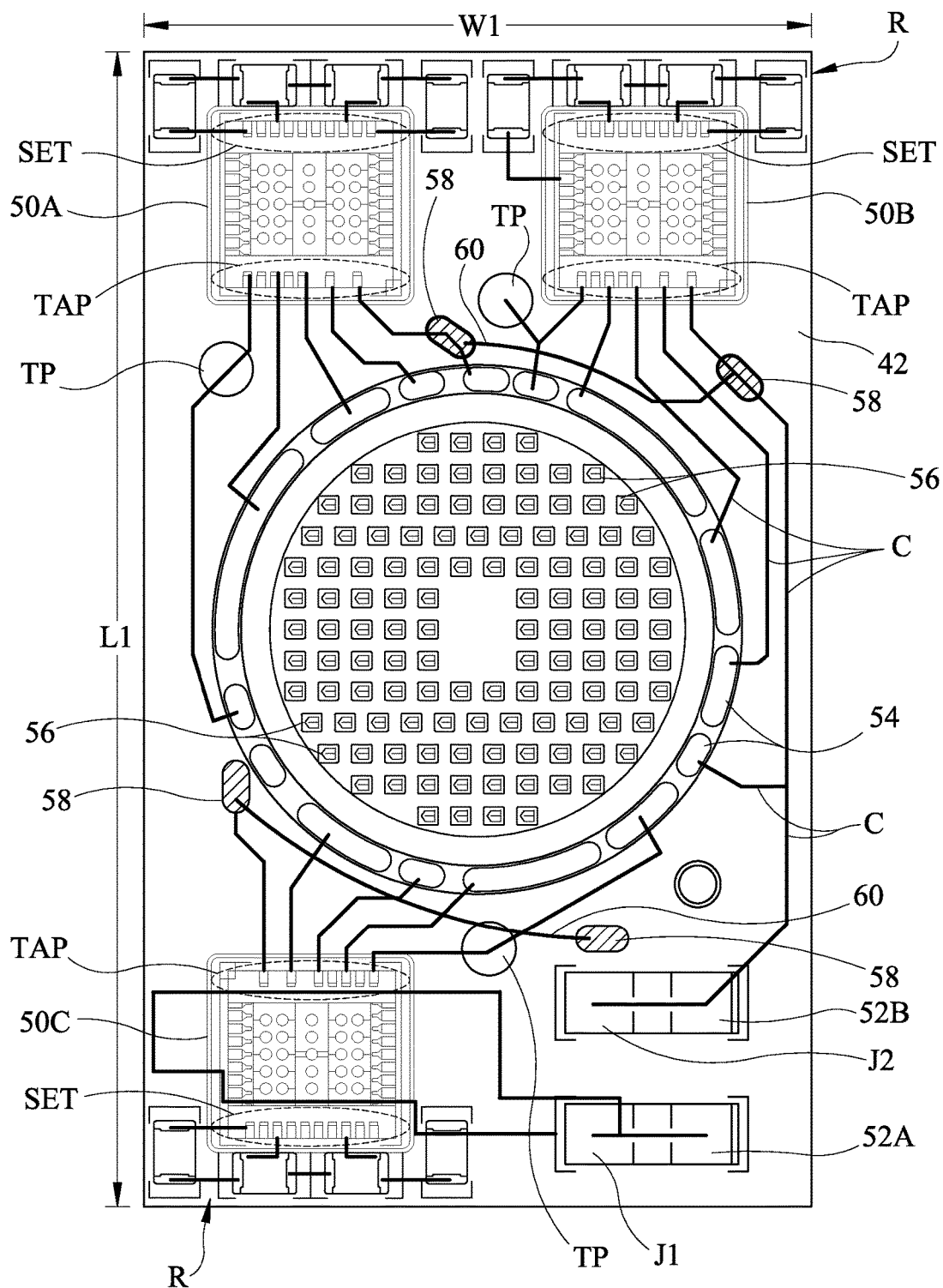
Figure 3C:
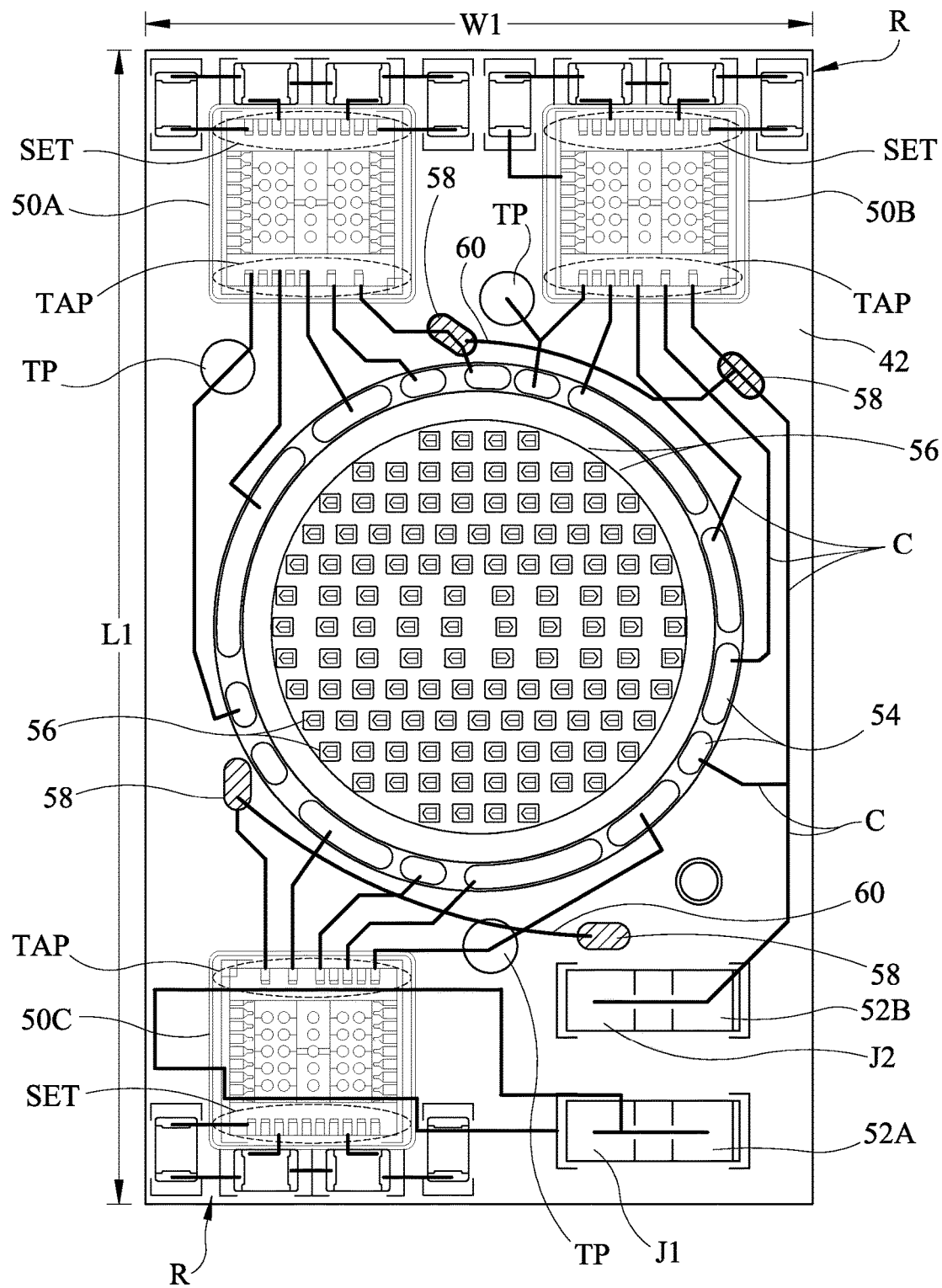
Figure 4:
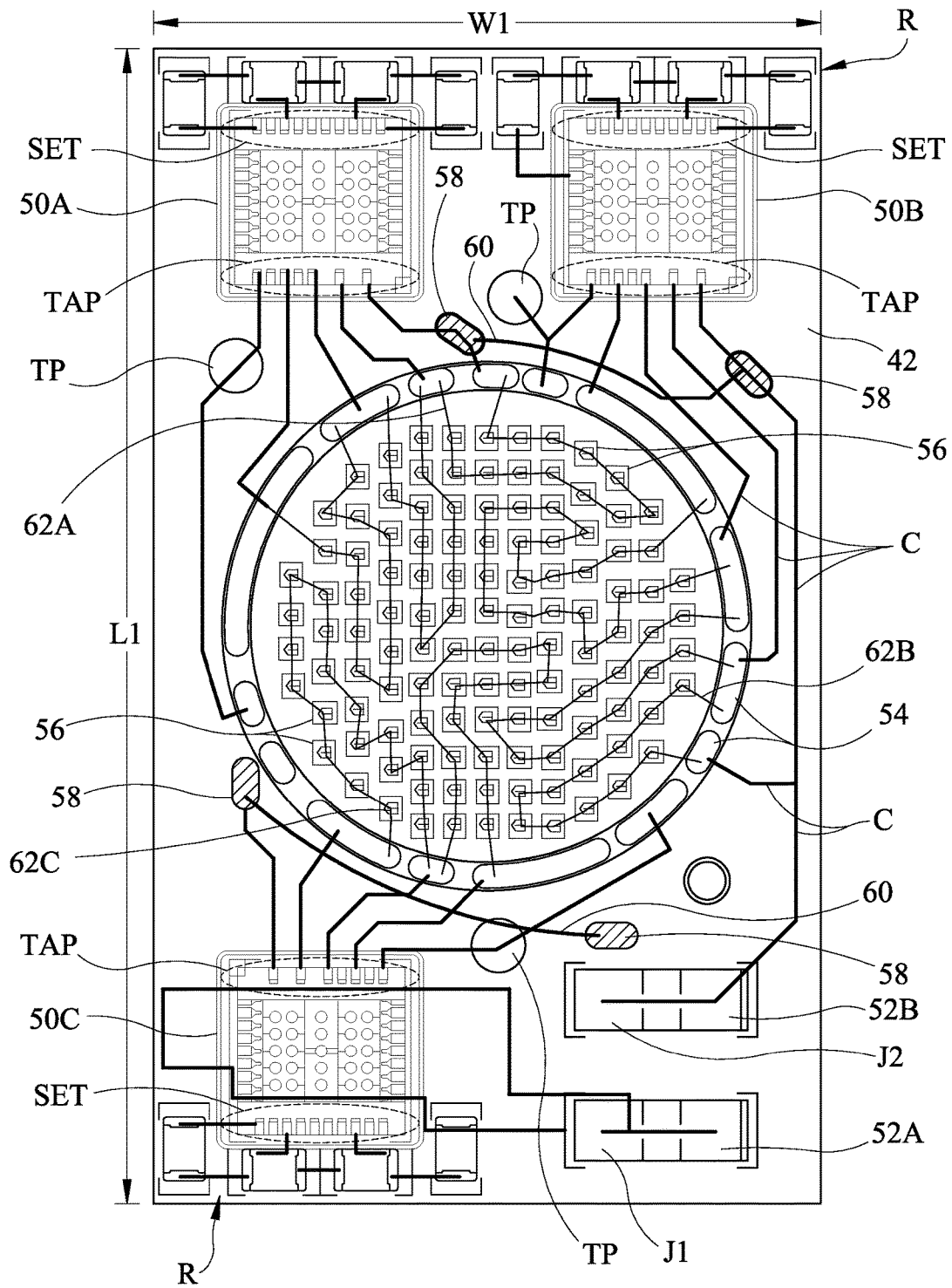

FIGS. 2-4 each illustrate an embodiment of an all die array, which is configured to reduce and/or prevent cracking of filling material 48 by configuring at least one predetermined group of solid state light emitters in the all die array to result in reduction of hot spots to ultimately achieve a more uniform heat distribution than with conventional arrays As used herein, "uniform heat distribution" means at least what a person of skill in the art would consider uniform for an array as disclosed for example herein, and "uniform heat distribution" also includes heat distribution from an array such as disclosed herein where heat from the array has been caused to be more evenly distributed across and from the array such that centralized or regional portions or groups of LEDs in the array do not significantly emit more heat that the other LEDs or groups of LEDs of the array. Each of FIGS. 2-4 illustrates a view of apparatus 40 without retention material 46, filling material 48, and/or a layer of solder mask such that electrical connectors, connections, and/or electrical traces are more readily visible, and are illustrative of various electrical components, traces, circuitry, connectors, plurality of solid state light emitters 56, and drive components 50A to 50C prior to masking or otherwise covering traces with electrically insulating and/or reflective coverings (e.g., solder mask).

In some non-limiting aspects, a plurality of solid state light emitters 56 can comprise an all die-array of light emitting devices (LEDs), such as, for example, a CXA array, SLX array, etc., available from CREE, INC.® of Durham N.C. Solid state light emitters 56 can be serially connected into strings or segments via electrical carriers C such as wires or wirebonds, where each string of solid state light emitters 56 can comprise a plurality of "chip-on-board" (COB) chips electrically coupled or connected in series or parallel with one another and mounted on a portion of substrate 42. In some aspects, each string of serially connected solid state light emitters 56 is electrically connected in parallel with and/or to other strings (not shown). In some aspects, chips 56 can be direct attach type chips (see, FIGS. 5A-7) mounted directly on portions of substrate 42 without the need for additional packaging (not shown).

Regardless of whether solid state light emitters 56 are connected intro strings or segments or are directly attached to portions of substrate 42, solid state light emitters 56 can for example comprise serial arrangements of LED chips, which can be differently colored, available from CREE, INC.® of Durham N.C., where the solid state light emitters 56 can receive power or current from different drive components 50A to 50C. Solid state light emitters 56 can be electrically connected in series, parallel, or combinations thereof.

With reference to FIGS. 2-4, solid state light emitters 56 can be arranged in different strings or segments, each of which has a different or targeted CCT value for dimming. For example, in some aspects, at least one string of solid state light emitters 56 is characterized as having a particular CCT value which is different from at least one other string of solid state light emitters 56. In other aspects, at least one string of solid state light emitters 56 is characterized as having a particular CCT value which is different from each other LED segment. Accordingly, as dimming proceeds, the light output from apparatus 40 shifts in CCT value according to the combination of each LED segment toward a targeted CCT value, such as reversibly dimming between approximately 2700K and 1800K.

The plurality of solid state light emitters 56 can be mounted over substrate 42 and electrically connected to one or more traces 54 via electrical connectors or carriers C. In some aspects, carriers C comprise wire bonds, however, carriers C can also comprise traces plated over substrate 42 for providing electrical connectivity between various components (e.g., solid state light emitters, resistors, power chips, etc.) of apparatus 40. Drive components 50A to 50C can comprise one or more packaged IC chips having a plurality of input circuits or set lines, generally designated "SET" lines and a plurality of output lines, generally designated "TAP" lines. Drive components 50A to 50C comprise input SET lines and output TAP lines configured to control an amount of current that is routed or pushed into respective solid state light emitters 56 (e.g., and strings thereof) mounted over substrate 42. Electrical current can enter apparatus 40 via connectors 52A and 52B, which connect directly to apparatus terminals J1 and J2. Current can pass into apparatus 40 via terminals J1 and J2, which comprise positive and negative terminals. The collective voltage of solid state light emitters 56 is operable at a user-defined line voltage, which can vary between approximately 90 VAC and 240 VAC, in some aspects, between 68 VAC and 240 VAC.

Apparatus 40 can comprise a length L1 and a width W1 of any dimension. In some aspects, substrate 42 can comprise a rectangle of a width W1 and a length L1 of approximately 10 mm or more×20 mm or more. Any size and/or shape of substrate 42 can be provided. In some aspects, at least 20 or more solid state light emitters are provided over substrate 42, at least 50 or more solid state light emitters are provided over substrate 42, at least 100 or more solid state light emitters are provided over substrate 42, or at least 68 or more solid state emitters are provided over substrate 42. Similarly, at least two drive components (e.g., 50A to 50C) can be provided over substrate 42, at least three drive components can be provided over substrate 42, at least four components drive can be provided over substrate 42, or more than four drive components can be provided over substrate 42.

In some aspects, substrate 42 comprises multiple trace layers, having traces disposed along different planes. For example, a first layer of traces 54 can be provided that is non-planer with a second layer of traces 60. Second layer of traces 60 can be disposed along a plane that is different from (e.g., above or below) first layer of traces 54. In some aspects, second layer of traces 60 is disposed along a bottom surface of apparatus. Second layer of traces 60 can connect to first layer of traces 54 via electrically conductive vias located in regions 58. Regions 58 can also contain both top and bottom trace layers.

As FIGS. 2-4 illustrate, each driving component 50A to 50C can be configured to drive different sets or strings of solid state light emitters 56. For example, first driving component 50A is configured to drive one or more strings of solid state light emitters 56, second driving component 50B is independent from first component 50A, and configured to drive other (e.g., mutually exclusive and separately switchable) strings of solid state light emitters 56, and third driving component 50C is configured to drive at least four other strings of solid state light emitters 56. More than three driving components 50A to 50C can be provided, and each component can drive at least one string of chips 56, at least two strings of chips 56, at least three strings of chips 56, at least four strings of chips 56, or more than four strings of chips 56. In some aspects, apparatus 40 driving components are individual operable and/or mutually exclusive for providing more efficient dimmable apparatuses.

In one aspect, solid state lighting apparatus 40 can comprise a large quantity of solid stare light emitters 56 arranged in one or more patterns over substrate 42. In one aspect, solid state lighting apparatuses disclosed herein comprise a quantity of more than 64 solid state light emitters 56. For example, in one aspect and without limitation, solid state lighting apparatus 40 can comprise 140 total solid state light emitters, or 12 strings of solid state light emitters 56 electrically connected in series. Other combinations of total solid state light emitters and number of strings can also be contemplated. Solid state light emitters 56 used in solid state lighting apparatuses described herein can comprise a small footprint, or surface area when compared to substrate 42. For example and without limitation, solid state light emitters 56 can comprise solid state light emitters of the following dimensions in Table 1 below:

TABLE 1

|  | Length (μm) | Width (μm) |
|---|---|---|
| Solid state light | 350 | 470 |
|  | 230 | 660 |
|  | 500 | 500 |
|  | 520 | 700 |

In one aspect and without limitation, the light emission area 44 can comprise a radius of approximately 6.568 mm and an area of approximately 135.5 mm$^2$. Thus, the ratio of the area of a single solid state light emitter 56 and the area of light emitting area 44 can comprise approximately 0.0027 or less. In one aspect, the ratio of the area of a single solid state light emitter 56 and the area of light emitting area 44 can comprise approximately 0.0018 or less. In other aspects, the ratio can comprise approximately 0.0012 or less. Table 2 below lists various solid state light emitter 56 chip sizes and the area of light emitting area 44. Solid state light emitters 56 can comprise chips that are small compared to the area of light emitting area 44, that is, approximately 0.0027 of the area of the light emitting area 44 or less. Any chip size can be used however.

TABLE 2

| Chip Size (μm) | Light Emitting Area (mm$^2$) | Ratio of Chip Area to Light Emitting Area |
|---|---|---|
| 350 × 470 | 135.5 | 0.0012 |
| 230 × 660 | 135.5 | 0.0011 |
| 500 × 500 | 135.5 | 0.0018 |
| 520 × 700 | 135.5 | 0.0027 |

Using a large quantity of solid state light emitters 56 comprising a smaller footprint over a single emission area 44 can advantageously allow for more uniform light output in addition desirable optical properties, such as high brightness, as the solid state light emitters 56 can be arranged into one or more uniform patterns over a portion of emission area 44. However, while the concentrated patterns of solid state light emitters 56 can allow for concentrated light emission, it also can increase temperature in a central portion of emission area 44. Thus, in one aspect, the concentration of solid state light emitters 56 can be decreased, or altogether removed, in at least a central portion of emission area 44. For example, solid state light emitters 56 can be non-uniformly spaced in relation to a length of apparatus 40 such that the chip density per area is less in the central portion of emission area 44 than in a peripheral portion of emission area 44. In another aspect, the density or spacing of solid state light emitters 56 can remain concentrated, either uniformly or non-uniformly in relation to length L1, while at least one driving component 50A to 50C can operate the longest (i.e., the hottest) strings 62A to 62C at different portions of an alternating current (AC) cycle.

FIG. 2 illustrates apparatus 40 with different sets or strings of solid state light emitters 56 mounted over substrate 42 and uniformly mounted about light emission area 44. Within the meaning of the present subject matter, "uniformly mounted" refers to the uniform spacing and/or orientation of chips 56 in relation to a length L1 of apparatus 40. For example, uniformly mounted chips 56 can be mounted in uniform columns with regard to length L1, wherein in each column, each chip 56 can be oriented side to side with the chip in front of and the chip behind, where applicable. For example, as in FIG. 2, there are 13 parallel columns of chips 56 in relation to length L1 of apparatus, where each column can have a different number of chips 56 and can be spaced approximately a same distance apart from another column. Conversely, "uniformly mounted" does not necessarily refer to the uniform spacing and/or orientation of chips 56 in relation to a width W1 of apparatus 40 and does not take into account whether or not chips 56 are mounted in uniform rows with regard to width W1. In addition, the mounting of the chips 56 is uniform in the sense that chips 56 are spaced approximately a same distance apart from one another in relation to length L1 across emission area 44. That is, chips 56 are evenly concentrated and have a uniform density across emission area 44.

Driving components 50A to 50C can be configured to drive different sets or strings of solid state light emitters 56, such that the different sets or strings of solid state light emitters 56 are operating at different portions of an AC cycle. In particular, apparatus 40 can be configured such that a predetermined set or strings of solid state light emitters 56 are on for more of the AC cycle than the other sets or strings of solid state light emitters 56. In some instances, the predetermined set or strings of solid state light emitters 56 can be strings that are longer in length than the other strings. Strings 62A to 62C can be predetermined strings that are longer in length compared with other strings in the array. Thus, for example, first driving component 50A can be configured to drive string 62A, second driving component 50B can be configured to drive string 62B, and third driving component 50C can be configured to drive string 62C, where each driving component 50A to 50C can independently drive their respective string at a different portion of the AC cycle in order to stagger the amount of heat dissipated by each of strings 62A to 62C. The remaining strings of chips 56 can be driven as usual by their respective driving component 50A to 50C. Such a configuration can result in reducing hot spots about light emission area 44 because not all of strings 62A to 62C will be operating simultaneously, and heat will not be dissipated from the hottest strings at one time. This can prevent temperature from increasing towards a central portion of light emission area 44, where strings 62A to 62C are concentrated. In the example illustrated in FIG. 2, the different sets or strings are the longest strings compared to the other strings of solid state light emitters 56 and are disposed nearest the central portion of light emission area 44. However, an alternative to the configuration illustrated in FIG. 2 is illustrated in FIG. 4 (described below), where strings 62A to 62C are disposed around a periphery of light emission area 44, away from the central portion of light emission area 44.

FIGS. 3A-3C illustrate different embodiments of apparatus 40 with different sets or strings of solid state light emitters 56 non-uniformly mounted over substrate 42 about light emission area 44. Within the meaning of the present subject matter, "non-uniformly mounted" refers to the non-uniform spacing and/or orientation of one or more chips 56 in relation to a length L1 of apparatus 40. For example, as in FIG. 3A, one or more chips 56 are mounted non-uniformly in relation to length L1, wherein each chip 56 can be oriented side to side, side to corner, and/or corner to corner with any and all surrounding chip(s) 56. To note, some chips 56 are mounted uniformly in relation to length L1, as indicated by some chips 56 being mounted in columns with regard to length L1, wherein in each column, each chip 56 can be oriented side to side with the chip in front of and the chip behind, where applicable. However, since one or more chips 56 are mounted non-uniformly in relation to length L1, solid state light emitters 56 are considered "non-uniformly" mounted about light emission area 44, overall. Conversely, "non-uniformly mounted" does not refer to the non-uniform spacing and/or orientation of chips 56 in relation to a width W1 of apparatus 40, and does not take into account whether or not chips 56 are mounted non-uniformly in relation to width W1.

Specifically referring to FIG. 3A, strings 62A to 62C can be the longest strings of solid state light emitters 56 with regard to the array of different sets or strings of solid state light emitters 56. Unlike the uniformly mounted strings 62A to 62C illustrated in FIG. 2, in FIG. 3A, strings 62A to 62C are non-uniformly mounted. That is, chips 56 are not evenly concentrated and have a non-uniform density across emission area 44. For example, a predetermined group of chips 56 and their corresponding strings 62A to 62C are more spaced apart, such that a central portion of emission area 44 has a lower chip per area density as compared with a peripheral portion of emission area 44 and emission area 44, as a whole. In a standard LED array, chips may, for example, be uniformly mounted approximately 200 μm apart from one another in the emission area. However, in FIG. 3A, the predetermined group of chips 56 disposed in the central portion of emission area 44 can for example be spaced apart approximately between 200 μm and 400 μm apart from one another while chips 56 in the peripheral portion of emission area 44 may be spaced 200 μm apart from one another.

From an optical standpoint, decreasing chip concentration has typically been viewed as detrimental to the ability to cast light into a beam by use of a point source. Yet, in view of the subject matter described herein, there is no optical detriment that results from decreasing chip concentration by spacing chips 56 farther apart than what is known in the art. In fact, by spacing out chips 56, reduction of hot spots can result. Accordingly, and with regard to the configuration of strings 62A to 62C in FIG. 3A, by reducing a chip density towards a central portion of emission area 44 through non-uniformly spacing predetermined strings 62A to 62C, the heat load per area is reduced in the central portion of emission area 44. In this regard, it is less likely for filling material 48 to crack. To further decrease the temperature of strings 62A to 62C, as in FIG. 2, in FIG. 3A driving components 50A to 50C can independently drive their respective string at a different portion of the AC cycle in order to stagger the amount of heat dissipated by each of strings 62A to 62C.

Referring to FIGS. 3B and 3C, second and third embodiments of apparatus 40 are illustrated. In these two embodiments, different arrangements or configurations of chips 56 are illustrated, both of which are non-uniformly spaced and oriented in relation to length L1. For enhanced clarity of the contemplated configurations of chips 56, wirebonds or carriers C are not illustrated. In FIG. 3B, as in FIG. 3A, one or more chips 56 are mounted non-uniformly in relation to length L1, wherein each chip 56 can be oriented side to side, side to corner, and/or corner to corner with any and all surrounding chip(s) 56. To note, some chips 56 are mounted uniformly in relation to length L1, as indicated by some chips 56 being mounted in columns with regard to length L1, wherein in each column, each chip 56 can be oriented side to side with the chip in front of and the chip behind, where applicable. However, since one or more chips 56 are mounted non-uniformly in relation to length L1, solid state light emitters 56 are considered "non-uniformly" spaced about light emission area 44, overall. However, one difference in FIG. 3B in comparison with FIG. 3A is that solid state light emitters 56 are spaced in parallel rows in relation to width W1. However, the arrangement and distribution of chips 56 in relation to width W1 is not necessarily taken into consideration when determining whether an array of chips 56 is uniform or non-uniform.

A difference between FIG. 3B and FIG. 3A is that a predetermined group of chips 56 are removed from a central portion of emission area 44. This is an alternative approach to FIG. 3A, where predetermined sets of strings 62A to 62C are merely non-uniformly spaced and oriented in central portion of emission area 44. Accordingly, by completely removing chips 56 from the central portion of emission area 44, as in FIG. 3B, the heat load per area in the central portion of emission area 44 is significantly decreased. However, several considerations need to be taken into account in this configuration. One of these is a decision on how many die to keep in the array; 68 die in the emission area can for example and in one configuration be a standard quantity. Thus, to keep 68 die, the spacing of the remaining die will have to be decreased to make room for the "chip-less" central portion of emission area 44. For example, rather than 200 μm spacing between each die, 100 μm between each die may be needed. This may raise the die density towards a peripheral portion of emission area 44. Another consideration is whether to decrease the quantity of die in emission area 44. Regardless, heat distribution will be more uniform and the risk of cracking of filling material 48 will be significantly decreased or eliminated completely through the configuration disclosed in FIG. 3B. To further decrease the temperature of strings 62A to 62C, as in FIG. 2, in FIG. 3B driving components 50A to 50C can independently drive their respective string at a different portion of the AC cycle in order to stagger the amount of heat dissipated by each of strings 62A to 62C (not shown).

In FIG. 3C, as in FIGS. 3A and 3B, one or more chips 56 are mounted non-uniformly in relation to length L1, wherein each chip 56 can be oriented side to side, side to corner, and/or corner to corner with any and all surrounding chip(s) 56. To note, some chips 56 are mounted uniformly in relation to length L1, as indicated by some chips 56 being mounted in columns with regard to length L1, wherein in each column, each chip 56 can be oriented side to side with the chip in front of and the chip behind, where applicable. However, since one or more chips 56 are mounted non-uniformly in relation to length L1, solid state light emitters 56 are considered "non-uniformly" mounted about light emission area 44, overall. However, one difference in FIG. 3C in comparison with FIG. 3A is that solid state light emitters 56 are spaced in parallel rows in relation to width W1. However, the arrangement and distribution of chips 56 in relation to width W1 is not taken into consideration when determining whether an array of chips 56 is uniform or non-uniform.

A difference between FIG. 3C and FIG. 3A is that a predetermined group of chips 56 is dramatically spaced out in a central portion of emission area 44. Specifically, approximately three predetermined rows of chips 56 (in relation to width W1) that are disposed in a central portion of emission area 44 are more greatly spaced apart from one another in comparison with the remaining rows of chips 56 within light emission area 44. More or less rows of predetermined chips 56 can be greatly spaced apart. For example, the predetermined rows of chips 56 can be spaced apart more than 200 μm, but less than 400 μm. This is an alternative approach to FIG. 3A, where predetermined sets of strings 62A to 62C are merely non-uniformly spaced in the central portion of emission area 44, and in FIG. 3B, where chips 56 are removed completely from the central portion of emission area 44. Accordingly, by greatly spacing three rows of chips 56 from a central portion of emission area 44, as in FIG. 3C, the heat load per area in the central portion of emission area 44 is significantly decreased. However, several considerations need to be taken into account in this configuration. One of these is a decision on how many die to keep in the array; 68 die in the emission area can for example and in one configuration be a standard quantity. Thus, to keep 68 die, the spacing of the remaining die will have to be decreased to make room for the "chip-less" central portion of emission area 44. For example, rather than 200 μm spacing between each die, 100 μm between each die may be needed. This may raise the die density towards a peripheral portion of emission area 44. Another consideration is whether to decrease the quantity of die in emission area 44. Regardless, heat distribution will be more uniform and the risk of cracking of filling material 48 will be significantly decreased or eliminated completely through the configuration disclosed in FIG. 3B. To further decrease the temperature of strings 62A to 62C, as in FIG. 2, in FIG. 3C driving components 50A to 50C can independently drive their respective string at a different portion of the AC cycle in order to stagger the amount of heat dissipated by each of strings 62A to 62C (not shown).

In another embodiment, as illustrated in FIG. 4, strings 62A to 62C can be disposed around a peripheral portion of light emission area 44, away from the central portion of light emission area 44. Strings 62A to 62C can be the hottest strings, as described above. By mounting strings 62A to 62C away from the central portion of light emission area 44, the heat being dissipated from these hottest strings can be distributed around the periphery of light emission area 44, rather than concentrated in the central portion of light emission area 44. To further improve heat distribution, driving components 50A to 50C can independently drive their respective string at a different portion of the AC cycle in order to stagger the amount of heat dissipated by each of strings 62A to 62C.

In FIG. 4, as in FIG. 2, one or more chips 56 are mounted uniformly, such that each chip 56 is mounted in columns in relation to length L1, wherein in each column, each chip 56 can be oriented side to side with the chip in front of and the chip behind, where applicable. However, FIG. 4 is a non-limiting example of disposing strings 62A to 62C with non-uniformly spaced chips 56. In another aspect, not shown, strings 62A to 62C can be disposed around a peripheral portion of light emission area 44, away from the central portion of light emission area 44, and can comprise non-uniformly spaced chips 56 in relation to length L1.

Further, the above described spacing and orientation of predetermined groups of chips 56, segments of chips 56, and/or hottest strings 62A to 62C can include additional patterns or arrangements for both the predetermined groups of chips 56 and/or remaining strings or individual LEDs 56. For example, LEDs 56 can be arranged or disposed in sets of LEDs, that can comprise one or more strings or LEDs, and a given set of LEDs can for example be one or more strings of LEDs electrically connected in series or any other suitable configuration. More than one set of LEDs can be provided, and each set of LEDs can be arranged in parallel to one or more other sets of LEDs. Thus, the one or more patterns described herein can be adjusted such that heat dissipation can be improved, while light extraction can be maintained or even improved by minimizing the amount of light absorbed by adjacent or neighboring solid state light emitters 56 in a central portion of light emission area 44. In addition, the number of solid state light emitters 56 per string can allow solid state lighting apparatuses 40 to be operable at low to high voltages. For illustration purposes, only two patterns have been illustrated in the following description. However, any suitable pattern of solid state light emitters 56 is contemplated.

In one aspect, the strings of solid state light emitters 56 can comprise at least one pattern, or arrangement, of solid state light emitters 56, where each string of solid state light emitters 56 can comprise the same or a different pattern. Strings of solid state light emitters 56 can comprise diodes of the same and/or different colors, or wavelength bins, and different colors of phosphors can be used in the filling material 48 disposed over solid state light emitters 56 that are the same or different colors in order to achieve emitted light of a desired wavelength. The one or more patterns of solid state light emitters 56 can comprise an array of solid state light emitters within emission area 44.

FIGS. 2 and 3A illustrate emission area 44 comprising, for example, 12 lines, or strings, of solid state light emitters 56. Each string of solid state light emitters 56 can comprise any suitable number of solid state light emitters 56 electrically connected between electrical ends, such as outermost solid state light emitters, which can connect to respective electrical elements. In one aspect, each string of solid state light emitters 56 can comprise at least 9 solid state light emitters 56, where longest strings of solid state light emitters 62A to 62C can for example comprise at least 12 solid state light emitters 56. By comparison, in FIG. 4, each string of solid state light emitters 56 can for example comprise at least 11 solid state light emitters 56, where longest strings of solid state light emitters 62A to 62C can also comprise at least 11 solid state light emitters 56. In one aspect, longest strings of LEDs 62A to 62C can dissipate more heat per chip than other strings of solid state light emitters. In some aspects, longest strings of solid state light emitters 62A to 62C can be disposed in a central portion of light emission area 44, whereas in other aspects, longest strings of solid state light emitters 62A to 62C can be disposed in a peripheral portion of light emission area 44.

In one aspect as shown in FIG. 2, each string of solid state light emitters 56 can each comprise a different arrangement or pattern of solid state light emitters 56. For example, string 62A can comprise 12 solid state light emitters 56, arranged in two parallel columns of six solid state light emitters 56 apiece in relation to length L1 of apparatus 40. In comparison, the solid state light emitters even in a single set or string in emission area 44 can comprise solid state light emitters in more than one pattern or configuration. For example, string 62C can comprise 12 solid state light emitters 56 disposed in at least two different patterns. A first pattern can comprise what is referred to herein as a grid arrangement, pattern or design, where at least two solid state light emitters are at least substantially aligned in at least two directions. Each of the solid state light emitters 56 comprising the first pattern can be electrically connected in series. In one aspect, a second arrangement or second pattern can be disposed adjacent the first pattern, for example, located at the end or beginning of the first pattern. In one aspect, the second pattern can for example comprise three solid state light emitters 56 arranged adjacent each other, in relation to width W1, along a horizontal line in a straight line design, or arrangement, and each of the three solid state light emitters 56 can be electrically connected in series. Any suitable number of solid state light emitters 56 can be connected in any suitable configuration or arrangement such as in series to form a string having a suitable pattern. Care must be taken when connecting solid state light emitters 56 in series such that the positive or negative electrode of preceding solid state light emitters electrically connects to an electrode of opposite electrical polarity for a subsequent LED for allowing electrical current to flow properly through the string of solid state light emitters 56.

A third pattern (not shown) can comprise a checkerboard pattern having a checkerboard design or arrangement of solid state light emitters 56 electrically connected in series. In one aspect, the third pattern can comprise a set of solid state light emitters 56 alternating both above and below a horizontal line. The above-described patterns are not limited in the shape of pattern or to at least the described number of solid state light emitters 56, but rather, patterns can comprise any suitable arrangement and any suitable number of solid state light emitters 56. For illustration purposes, only two patterns are illustrated although any suitable number of patterns could be utilized.

Alternatively, solid state light emitter 56 can comprise a direct attach type of chip that is horizontally structured such that electrically connecting chip to electrical components does not require wire bonding or strings. For example, solid state light emitters 56 can comprise a horizontally structured device where each electrical contact (e.g., the anode and cathode) can be disposed on a bottom surface of solid state light emitter 56. Die attaching solid state light emitter 56 using any suitable material and/or technique (e.g., solder attachment, preform attachment, flux or no-flux eutectic attachment, silicone epoxy attachment, metal epoxy attachment, thermal compression attachment, and/or combinations thereof) can directly electrically connect solid state light emitters 56 to conductive pads without requiring wire bonds. Solid state light emitters 56 can also be connected to one another through direct attach, rather than using wirebonds or strings.

Figure 5:
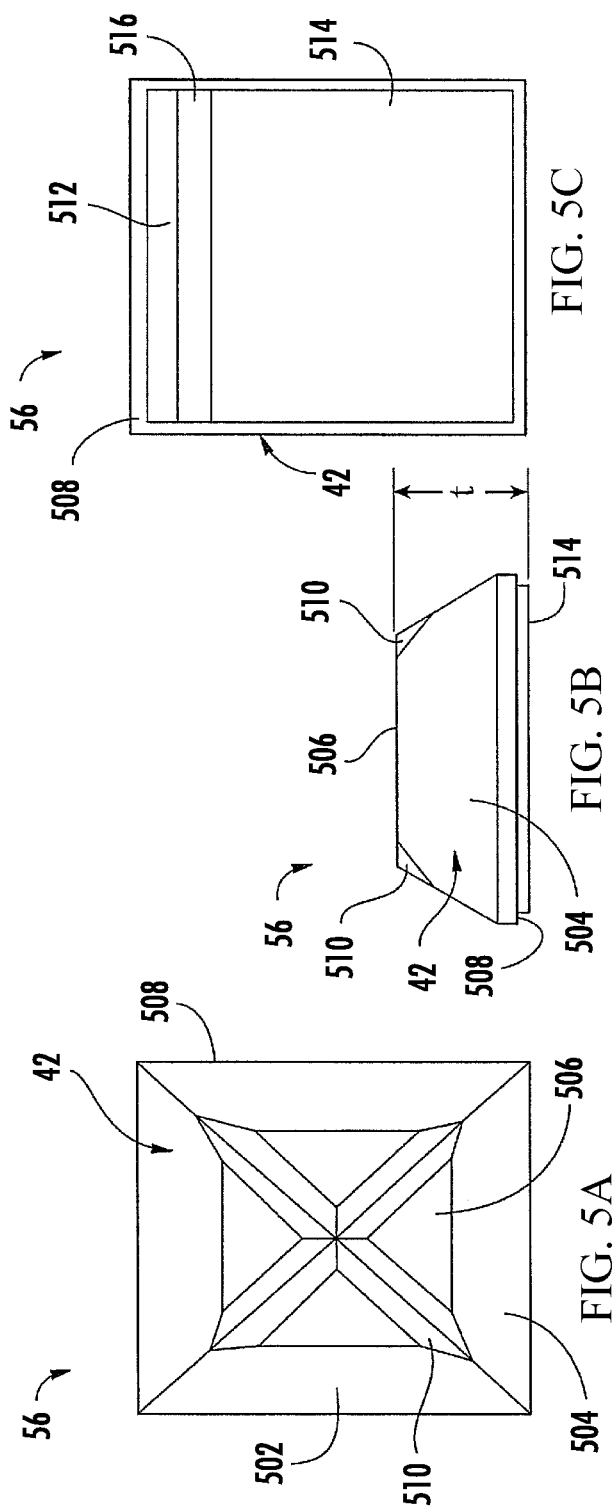
FIGS. 5A through 5C are top, side, and bottom views, respectively, illustrating an exemplary solid state light emitter according to some aspects of the present subject matter.
Figure 6:
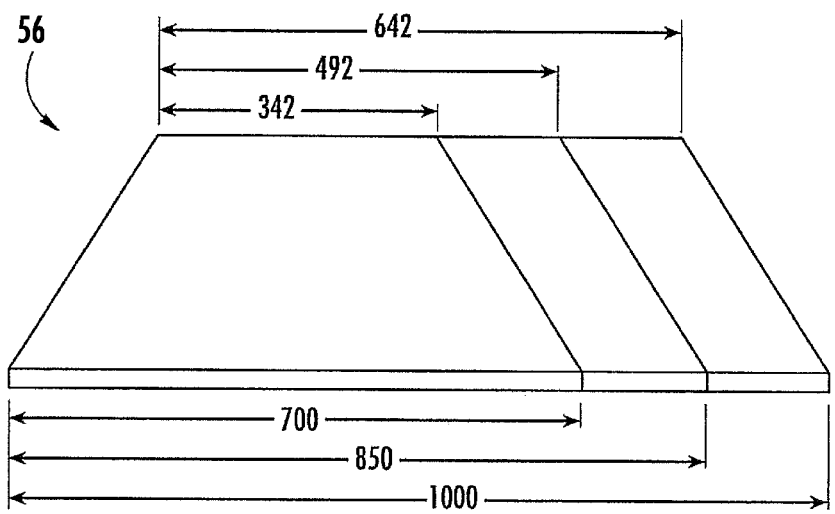
FIGS. 6 and 7 are side views illustrating an exemplary solid state light emitter according to some aspects of the present subject matter.
Figure 7:
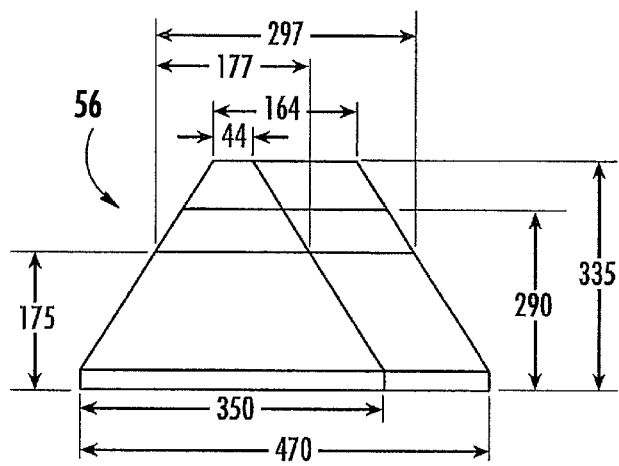

For example, the solid state light emitters 56 can be or comprise any of the embodiments depicted by FIGS. 5A to 7. For example, solid state light emitter 56 can comprise a substrate, generally designated 42, that is bevel cut, thereby providing a chip having angled or beveled surfaces disposed between an upper face and a lower face. Specifically, FIGS. 5A to 5C illustrate an embodiment where the solid state light emitter 56 is a substantially square shaped chip where adjacent surfaces 502 and 504 can comprise substantially the same length. For example and without limitation, the solid state light emitter 56 can be a square shaped chip, such as a CREE® DA 500 chip commercially available with adjacent surface lengths of 500 µm each. FIG. 7 illustrates an embodiment where a substrate of solid state light emitter 56 can comprise a substantially rectangular shaped chip where adjacent surfaces 502 and 504 are different lengths. For example, the chip can be a CREE® DA 250 solid state light emitter and can have one adjacent surface length at 250 µm and the other one at a longer length. As illustrated in FIG. 6, some embodiments of the solid state light emitter 56 can have adjacent sides 502 and 504 of approximately 1 mm in length (e.g., 1000 µm) or less in at least one direction. In other aspects, each of the adjacent sides 502 and 504 can comprise approximately 0.85 mm (e.g., 850 µm) in length or less in at least two directions, such as approximately 0.70 mm (e.g., 700 µm), 0.50 mm (e.g., 500 µm), 0.40 mm (e.g., 400 µm), and 0.30 mm (e.g., 300 µm) or less. Solid state light emitters 56 can comprise a thickness t of approximately 0.40 mm or less (e.g., 400 µm or less) such as 0.34 mm (e.g., 340 µm) or less. In one aspect and as illustrated in FIG. 5B, solid state light emitter 56 can comprise a thickness t of approximately 0.335 mm (e.g., 335 µm) or various sub-ranges of thicknesses t from 0.15 to 0.34 mm, such as: approximately 0.15 to 0.17 mm (e.g., 150 to 170 µm); 0.17 to 0.2 mm (e.g., 170 to 200 µm); 0.2 to 0.25 mm (e.g., 200 to 250 µm); 0.25 to 0.30 mm (e.g., 250 to 300 µm); and 0.30 to 0.34 mm (300 to 340 µm).

In some aspects, solid state light emitter 56 can be approximately 4 mm$^2$ or less in total surface area, while in other aspects solid state light emitter 56 can be 2 mm$^2$ or less in total surface area. In some aspects, solid state light emitter 56 can comprise an area (e.g., product of the lengths of adjacent sides 502 and 504) of approximately 0.74 mm$^2$ or less, for example, 0.72 mm$^2$ or less. In other aspects, solid state light emitter 56 can be various sub-ranges of surface area from approximately 0.25 to 0.72 mm$^2$, for example, such as: approximately 0.25 to 0.31 mm$^2$; 0.31 to 0.36 mm$^2$; 0.36 to 0.43 mm$^2$; 0.43 to 0.49 mm$^2$; 0.49 to 0.56 mm$^2$; 0.56 to 0.64 mm$^2$; and 0.64 to 0.72 mm$^2$. In one aspect, an upper face 506 can comprise a smaller surface area than a lower face 508. One or more beveled or angled sides, such as adjacent surfaces 502 and 504 can be disposed between upper and lower faces 506 and 508, respectively. At least one groove, such as an X-shaped groove 510 can be disposed in upper face 506 of solid state light emitter 56. Multiple X-shaped grooves and/or other shaped grooves can also be provided. In one aspect, grooves 510 can improve light extraction.

As illustrated by FIG. 5C, solid state light emitter 56 can comprise electrical contacts on the same surface, for example, bottom face 508. Electrical contacts can comprise an anode conductive pad 512 and a cathode conductive pad 514 which can collectively occupy less area than diode's active region. Anode 512 can be at least partially disposed over and electrically communicate with a conductive pad (not shown). Cathode 514 can be at least partially disposed over and electrically communicate with conductive pad (not shown). A gap 516 can be disposed between anode 512 and cathode 514. In one aspect, gap 516 can for example be approximately 75 µm or less. After die attachment of solid state light emitter 56 to the conductive pads, gap 516 can be at least partially disposed over a gap of solid state lighting apparatus 40. Alternatively, in some aspects, solid state lighting apparatuses can comprise anode 512 and cathode 514 contacts of similar sizes.

Alternatively, in some aspects, solid state light emitter 56 can be a chip that does not comprise angled or beveled surfaces. For example, solid state light emitter 56 can be any solid state light emitter or a solid state light emitter that comprises coplanar electrical contacts on one side of the solid state light emitter (bottom side) with the majority of the light emitting surface being located on the opposite side (upper side).

FIGS. 6 and 7 illustrate various measurements of a substrate of solid state light emitter 56. FIG. 6 illustrates various dimensions for square adjacent sides 502 and 504. FIG. 7 illustrates various dimensions for a rectangular chip where adjacent sides 502 and 504 are different, for example, where side 502 is smaller than side 504. FIG. 7 illustrates various dimensions of the smaller and larger sides 502 and 504 of a thickness of substrate 42. In one aspect, adjacent sides 502 and 504 can comprise approximately 350 µm×470 µm and can comprise a thickness, or height, of approximately 175 µm or greater. In other aspects, the substrate can comprise a height of approximately 290 µm or greater. In further aspects, the substrate can comprise a height of approximately 335 μm or greater (e.g., 0.335 mm). In one aspect, upper face 506 can be a rectangle of approximately 177 μm×297 μm in length and width. In other aspects, upper face can be a rectangle of approximately 44 μm×164 μm in length and width. In one aspect, such solid state light emitters 56 can have a ratio between area of upper face 506 and area of adjacent sides 502 and 504 of approximately 0.4 or less. It has been found that the light extraction and output is improved as the ratio of the area of upper face 506 to the area of sides 502 and 504 is reduced.

Regardless, a particular spectral power distribution can be generated by the combination of all of the solid state light emitters 56 and/or segments when the light is full on, for example. When the light is dimmed, however, the current provided to the targeted solid state light emitters 56 or strings is mostly maintained and the current to the non-targeted solid state light emitters 56 or strings is greatly reduced so that the spectral power distribution shifts toward a targeted spectral power distribution that is pre-defined by the solid state light emitters 56 included in the targeted solid state light emitter segment. Accordingly, the targeted spectral power distribution can have different lighting characteristics than that provided by the combination of all solid state light emitters 56 or segments.

When all segments are activated or powered "on", the apparatus can emit a color temperature that is that tuned to approximately 2700K or approximately 3000K, and a light output of approximately 4000 lumens and approximately 90 LPW or more. As each segment, turns from "on" to "off", the light warms from approximately 2700K (e.g., or about 3000K) to 1800K as it dims. It is understood that control of separately switchable solid state light emitters and/or segments may further be provided according to any method. For example, in some aspects according to the present subject matter, the switching may be provided using the techniques described in commonly assigned U.S. Pat. No. 8,476,836, the disclosure of which is incorporated herein by reference.

Referring to direct drive control circuitry or components 50A to 50C, each component can comprise a packaged or housed IC opponent, such as a power chip, configured to supply electrical current to each solid state light emitter 56, or groups of solid state light emitters 56. Each solid state light emitters within a string of chips 56 can receive a same amount of electrical current or different amounts of electrical current at various times for achieving a desired amount of illumination, color, and/or color temperature from each of the plurality of solid state light emitters 56 and respective strings of chips. In some aspects, some solid state light emitters 56 or segments remain "on", while others remain dark or "off". In some aspects, each solid state light emitter 56 and/or respective solid state light emitter segment is individually controlled for providing any illumination level and/or color temperature between a fully "on" state and any dimmed state that is below the fully "on" state.

Components 50A to 50C are configured to receive a direct, rectified AC signal and controlling current supplied to a plurality of solid state light emitters 56. Components 50A to 50C can control an amount of electrical current collectively and/or individually supplied to solid state light emitters 56 in response to a change in line voltage, a control signal, an input, or any other control parameter. For example, components 50A to 50C can supply current collectively and/or individually to one or more solid state light emitters and/or segments in response to activation or physical movement of a dimmer switch, a pre-set condition, a user-defined condition, one or more inputs or other control parameters, any perceptible change in line voltage, or a sensor arranged to sense or detect electrical, optical, environmental and/or thermal properties. In one aspect, components 50A to 50C can supply current individually to one or more strings 62A to 62C of solid state light emitters 56 at different portions of the AC cycle.

In some aspects, components 50A to 50C can comprise what is referred to as a "smart" power chip. The power chip is configured to monitor the input voltage and determine at what times or portions of a rectified AC waveform the solid state light emitters 56 disposed in segments be switched "on" and "off". In some aspects, components comprise a control circuit adapted to issue control commands for activating and/or deactivating solid state light emitters 56 in response to processing the monitored changes of input voltage.

In some aspects, components 50A to 50C can comprise a flat no-lead IC package, for example, a quad-flat no-lead (QFN) surface mount package, a dual-flat no-lead (DFN) surface mount package, and/or a micro leadframe package (MLP). Such packages are configured to physically and electrically connect to portions of substrate 42 via electrically conductive members, portions, and/or surfaces thereof, such as exposed metallic leads.

Flat no-lead packages refer to packages having leadframe substrates, however, the "leads" are not externally extending from lateral sides of the package, for example, in a J-bend or gull-wing type configuration. Rather, components 50A to 50C can comprise a near chip sized package having a planar copper lead frame substrate encapsulated in plastic, Perimeter leads on a bottom surface of an encapsulated or un-encapsulated package component 50A can provide a direct electrical connection between chips 56 and other electrical components provided on or over substrate 42. In some aspects, components 50A to 50C comprise an exposed thermal pad for improving heat transfer out of the chip and into substrate 42. In some aspects, one or more through holes or "vias" can be provided in the substrate 42 below the thermal pad of components 50A to 50C for improving thermal management within apparatus 40.

In order to further improve thermal management of apparatus 40, substrate 42 can comprise a protective lens, coating, and/or filling material 48 over the array of solid state light emitters 56, which can comprise an encapsulant or resin having a non-uniform distribution of wavelength conversion material provided therein. In some aspects, the encapsulant or resin includes a highly viscous and curable silicone resin or encapsulant. For example, FIGS. 8A-8F illustrate a substrate 42 comprising a filling material 48 disposed over the array of solid state light emitters 56. In FIGS. 8A-8F, substrate 42 comprises a core layer 30, a dielectric layer 36, an electrically conductive mounting pad or light emission floor 64, first and second conductive traces 66 and 34, and a reflective solder mask material 36 at least partially disposed between light emission floor 64 and each of conductive traces 66 and/or 34.

The wavelength conversion material can comprise any suitable lumiphoric or phosphoric material, such as phosphors P configured to emit yellow, green, blue, red, and/or white light upon activation or impingement with light emitted by one or more chips 56 in the array of solid state light emitters 56. Concentrating and/or or settling a greater density of the wavelength conversion material within one or more predetermined portions of emission area 44 in accordance with the disclosure herein can advantageously prevent problems with the encapsulant or resin such as cracking of the encapsulant or resin, which can be wide and/or shallow between optional retention dam 46. Other benefits include, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

As solid state light emitters 56 of apparatus 40 generate heat, the phosphor or phosphor particles P also heat up and ultimately lead to silicone or encapsulant cracking, unless the heat is quickly channeled down into the package 42, in some aspects, via settling of the phosphor over substrate 42 and solid state light emitters 56. In some aspects, phosphor P can be the hottest part of the apparatus 40.

In some aspects, the wavelength conversion material can comprise one or more phosphors P that are settled and/or more highly concentrated within one or more predetermined portions of filling material 48 for providing a thermal barrier between heat generating solid state light emitters 56 and portions of filling material 48 that are devoid and/or less concentrated with phosphors P. The higher density areas of settled phosphor P in accordance with the disclosure herein are cooler during operation by causing heat to more readily escape or route through substrate 42.

In some aspects, filling material 48 alone, such as silicone encapsulant, can be subject to severe thermal loads and/or thermal degradation over time. For example, filling material 48 can comprise a wide and shallow silicone encapsulant "puck" that can be susceptible to localized heating and cracking via heat generated at solid state light emitters 56 and heat generated by the florescence (e.g., phosphoric) centers dispersed in the encapsulate filling material 48. Settling wavelength conversion material such as phosphor P close to the solid state light emitters 56 and/or substrate 42 (e.g., light emission floor 64) provides a barrier promoting an improved heat transfer route into the heat-sinking substrate 42 and thereby alleviating encapsulant overload due to thermal stress. This can advantageously prevent catastrophic damage of device 100 and prolong the useful operating life of apparatus 40. Other benefits of settled wavelength conversion material (e.g., phosphor, P) include, for example, improved far field images (e.g., thereby promoting a very uniform color appearance in the far field with a larger viewing angle), lower color shifts (lower dCCT), improved long term reliability (e.g., improved brightness maintenance (optics) at approximately 1000 hours or more), higher product ratings, cooler phosphor operating temperatures, and/or a lower color point spread, including all or any combination of such features.

Figure 8A:
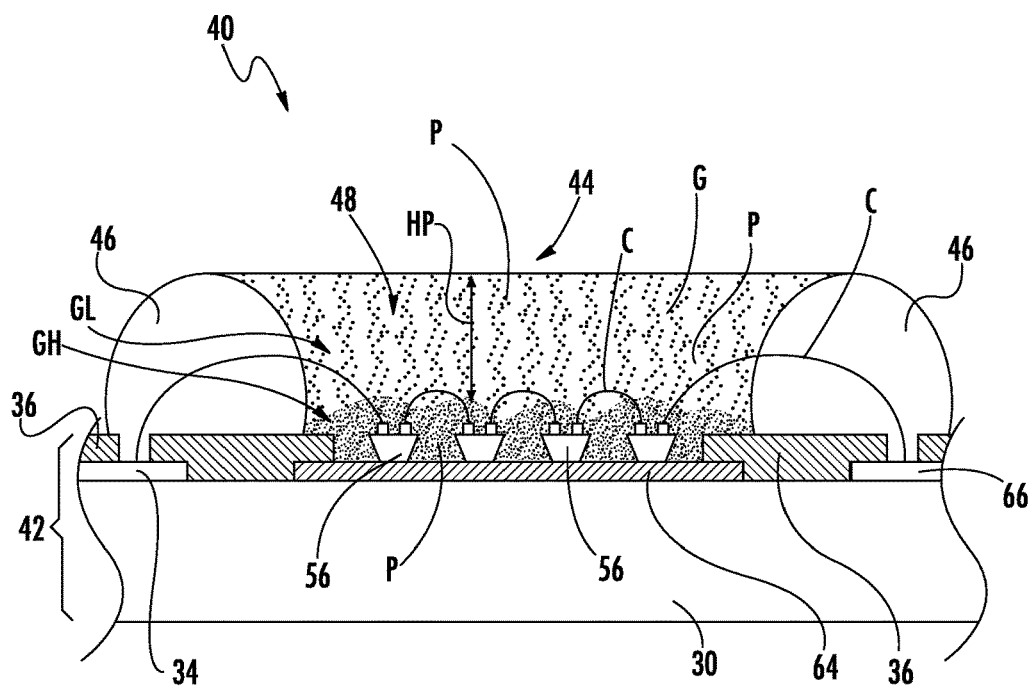
FIGS. 8A through 8F are sectional views illustrating various exemplary embodiments of solid state lighting apparatuses comprising phosphoric filling material according to some aspects of the present subject matter.

As FIG. 8A illustrates, wavelength conversion material such as one or more phosphors P can be selectively added in any desired amount or quantity to filling material 48. Notably, filling material 48 comprises a non-uniform suspension of phosphor P particles in the bulk of the encapsulant filling material 48. Phosphor P is settled, concentrated, and/or more densely packed towards a bottom of the encapsulant filling material 48 between and/or over the solid state light emitters 56. Settling of the phosphor P is achieved via any suitable method including, for example, gravity sedimentation, centrifuge, addition of a solvent, and/or vibration, including for example as described in U.S. Pat. No. 8,410,679 to Ibbetson et al., and U.S. Pat. No. 8,425,271 to Hussell et al., the disclosures of which are each hereby incorporated by reference herein in their entireties. Other possible settling methods comprise engineering the phosphor particle(s) size (s) to promote settling and adjusting the fluorescent (e.g., phosphoric) powder flow characteristics (e.g., clumpiness, flow rate, compaction, temperature, humidity, electro-static charge, aeration, storage time, etc.). Phosphor settling may also be caused and/or accelerated by reducing the viscosity of filling material 48 via heating to intermediate temperatures. As filling material 48 is heated, it becomes less viscous causing phosphor P particles to settle more quickly towards a bottom of the filling material 48, for example, proximate light emission floor 64 and/or over solid state light emitters 56.

Phosphor P can comprise one or more of a wide variety of wavelength conversion materials including luminescent materials. Examples of luminescent materials (lumiphors) include phosphors, Cerium-doped Yttrium Aluminum Garnet (YAG), Nitrides, Oxy-Nitrides, scintillators, day glow tapes, nanophosphors, quantum dots (e.g., such as provided by NNCrystal US Corp. (Fayetteville, Ark.), and inks that glow in the visible spectrum upon illumination with (e.g., ultraviolet) light. Inclusion of lumiphors in solid state light emitters has been accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

In some aspects, apparatus 40 can comprise one or more blue solid state light emitters and/or a cyan solid state light emitter in combination with a lumiphoric material containing layers that include first, second and third phosphors P therein. A first phosphor may down-convert light received from the blue solid state light emitter to light having a peak wavelength in the green color range. This phosphor may have a sufficiently broad full width half maximum (FWHM) bandwidth such that its FWHM emission spectra falls into at least part of the cyan color range. In some embodiments, this first phosphor may comprise a LuAG:Ce phosphor (i.e., cerium doped LuAG). LuAG:Ce phosphors may have a peak emission wavelength of between 535 and 545 nanometers, and a FWHM bandwidth of between about 40-115 nanometers. As such, the FWHM bandwidth of LuAG:Ce phosphors may extend throughout the entire cyan color range. A second phosphor may down-convert light received from the blue solid state light emitter and/or cyan solid state light emitter to light having a peak wavelength in the yellow color range. In some embodiments, this second phosphor may comprise a YAG:Ce phosphor. A third phosphor may down-convert light received from the blue LED and/or cyan solid state light emitter to light having a peak wavelength in the red color range. In some embodiments, this third phosphor may comprise a $(Ca_{1-x}Sr_x)SiAlN_3:Eu^{2+}$ phosphor.

In some aspects, a LuAG:Ce phosphor and a YAG:Ce could be grown together in a single cerium-doped structure (e.g., layer) that includes lutetium, yttrium, aluminum and oxygen. For example, the LuAG:Ce phosphor and the YAG:Ce could be implemented together as a $Lu_{1-x}Y_xAl_5O_{12}:Ce$ material. Such a material would act as both a first phosphor that emits light like a LuAG:Ce phosphor and a second phosphor that emits light like a YAG:Ce phosphor (which would provide a combined spectrum having a peak between the peak wavelength of the LuAG:Ce phosphor and the peak wavelength of the YAG:Ce phosphor). Thus, it will be appreciated that the first and second phosphors may comprise two separate phosphors, two separate phosphors that are mixed together, and/or a composition in which both phosphors are grown together in the same structure.

Phosphor P can be applied to or over the solid state light emitters 56 according to various techniques including, but not limited to, spraying, screen printing, evaporation (sputter, e-beam, thermal, CVD, electrostatic and/or electrophoric deposition), dipping, spin coating or direct dispensing over the die within a dammed/bounded area within retention material 46 and/or other techniques. The thickness of phosphor P over solid state light emitter 56 can, for example, range between approximately 2 μm and approximately 100 μm, however, any thickness of phosphor P can be provided. The thickness that is used may be selected to reduce or minimize self-absorption and/or scattering and may depend on the coating process, the density of the phosphor and/or the desired application.

Settling or concentrating phosphor P in a predetermined portion of filling material 48 (e.g., towards the bottom or bottom portion of filling material 48) can alleviate failure of device 40 due to thermal stress or cracking of the filling material 48, as such problems can occur in devices having uniform dispersions or suspensions of phosphor in a filling material. Localized heat generated from solid state light emitters is known to cause cracking in filling material having a uniform suspension or dispersion of phosphor therein. Notably and as FIG. 8A illustrates, filing material 48 has a non-uniform suspension of phosphor P provided therein.

After phosphor P settles or more densely occupies one or more portions of filling material 48, the filling material 48 can be cured thereby fixing the phosphor P in place. Notably, phosphor P forms a thermal barrier over solid state light emitters 56, which causes heat generated thereby to dissipate more readily into substrate 42. As a result of the phosphor P running cooler, apparatus 40 runs cooler, solid state light emitters 56 run brighter, and optical properties (e.g., higher luminous flux, improved color rendering, decreased color shifting, etc.) of apparatus 40 also improve. As noted herein, a lumen density or luminous flux density emitted from apparatus 40 can increase to approximately 30 lm/mm$^2$ or more as thermal management improves within apparatus 40 via settling or concentrating phosphor P to predefined portions of device 40. Solid state light emitters 56, filling material 48, and wavelength conversion material, for example, phosphor P can each be provided at or below an upper surface of filling material 48.

Figure 8B:
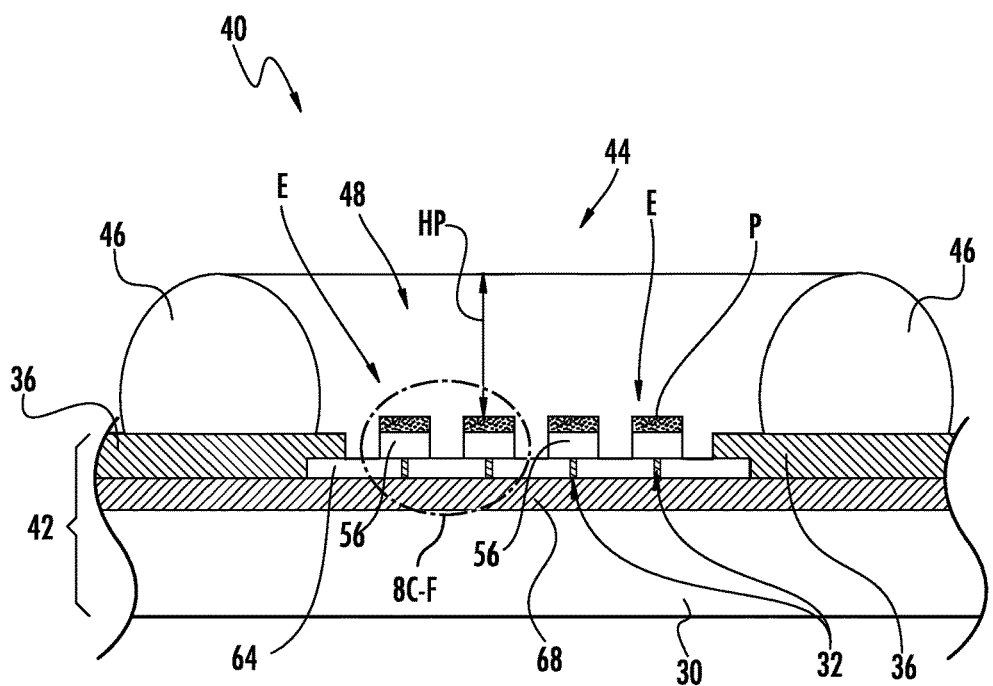

Referring generally to FIGS. 8A and 8B, substrate 42 can, for example, have a thickness or height of approximately 1 mm. Filling material 48 can, for example, have an overall height or thickness of approximately 0.6 mm. Settling or otherwise concentrating an amount of phosphor P towards emission floor 64 and over chips provides a layer of phosphor P that is, for example, approximately 0.25 mm or more, depending upon solid state light emitters 56. Filling material 48 thus can be relatively shallow compared to a diameter of light emission area 44. A height HP at or above a surface of the settled phosphor P to an upper surface of the filling material 48 is approximately 80 μm (i.e., 0.08 mm).

In FIG. 8A, device 40 comprises a non-uniform gradient, generally designated G, of phosphor P particles suspended or dispersed within filling material 48. A gradient G of phosphor P particles comprises a lower gradient $G_L$ region, where phosphor particles P are provided in a lower concentration or density, and a higher gradient region $G_H$, where phosphor particles are provided in a higher concentration within filling material 48. The concentration or gradient G of phosphor P particles within filling material 48 increases as the filling material 48 becomes closer to floor 64 of substrate 42. Phosphor P particles may disperse, distribute, clump or settle at the bottom of the filling material "puck" 48 for preventing excessive local heating and cracking of filling material 48.

FIG. 8B illustrates another embodiment of apparatus 40, where emission area 44 comprises horizontally structured light emitters E that are devoid of wirebonds C. Light emitters E can comprise a solid state light emitter 56 having a layer of phosphor P disposed over solid state light emitter 56. In some aspects, the phosphor coating P is formed over solid state light emitter 56 during fabrication thereof. In some aspects, phosphor P is only provided over at least one surface of each solid state light emitter 56. In other aspects, phosphor P is provided over two or more surfaces of each solid state light emitter 56 (e.g., FIG. 8D), Solid state light emitters 56 can be directly attached to electrically conductive emission floor 64 of substrate 42. Emission floor 64 can be provided over an optional dielectric layer 68 and core material 30. Dielectric layer 68 and/or core layer 30 can, for example, comprise FR-4 where emission floor 64 is attached thereto via a sticker or adhesive.

Mounting pad 64 of substrate 42 can comprise one or more electrically insulating or separating portions 32 comprising electrically insulating material. Separating portions 32 allow electrical signal to flow across separate terminals or bond pads disposed on a bottom surface of each solid state light emitter 56. That is, in one aspect solid state light emitters 56 can comprise horizontally structured chips having both the anode and cathode bond pads directly attached to emission floor 64. Separating portions 32 provide a barrier between the anode and cathode bond pads of solid state light emitters 56, such that electric current can flow into and out of the solid state light emitters 56 via the bond pads, thereby illuminating the solid state light emitters 56. Solid state light emitters 56 can be electrically connected only in parallel, only in series, or in an arrangement comprising a combination of parallel and series. Notably, concentrating or confining phosphor P only over solid state light emitters 56 can provide a thermal barrier between the heat generating solid state light emitters 56 and the remainder of filling material 48 (e,g., that is devoid of phosphor P). This can advantageously provide improved thermal management within apparatus 40 as heat becomes more efficiently routed to heat-sinking substrate 42 thereby allowing phosphor P to run cooler during operation. As phosphor P runs cooler, flux density increases luminous flux emitted from light emission area 44 increases, color rendering increases, and/or sulfur resistance improves, including all or any combination of such features. Methods for fabricating light emitters E comprising solid state light emitters 56 having a planarized coating of phosphor P integrated therewith are discussed by way of example in U.S. Patent Application Publication No. 2008/0179611 to Chitnis et al., the disclosure of which is hereby incorporated by reference herein in the entirety.

FIGS. 8C to 8F illustrate detail views of other embodiments of solid state light emitters 56 and phosphor P which may be used in apparatus 40 in place of the emitters E illustrated in FIG. 8B.

Figure 8C:
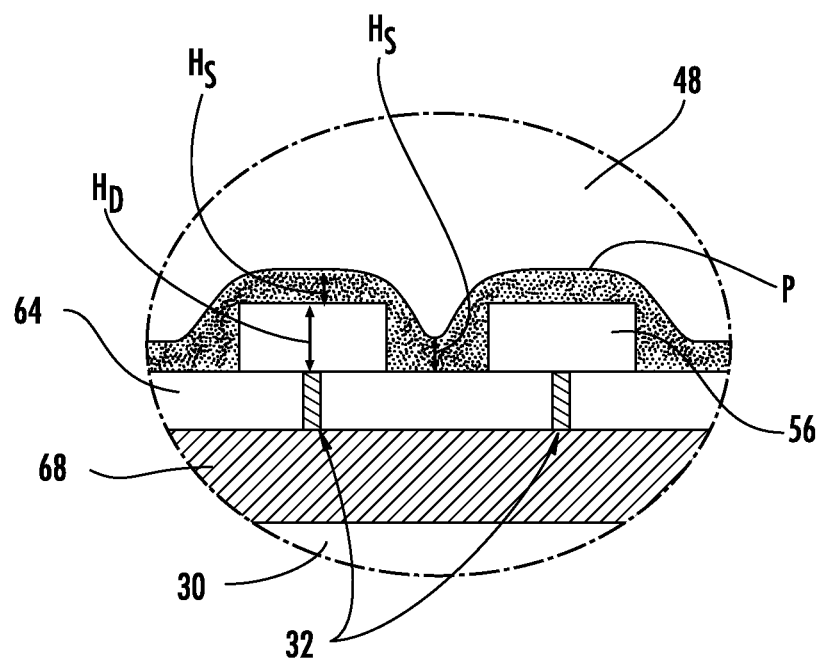

Referring to FIG. 8C, a layer of phosphor P can generally settle or otherwise be provided proximate a bottom of filling material 48 and generally conform to the shape of solid state light emitters 56 in a conformal layer that can, for example, have an at least substantially uniform thickness. In some aspects, phosphor P is sprayed over solid state light emitters 56 prior to addition of a silicone filling material 48. A sprayed and/or settled layer of phosphor can, for example, comprise a uniform thickness or height $H_S$ of approximately 100 μm (i.e., 0.1 mm) or more over each solid state light emitter 56. Solid state light emitters 56 can comprise any suitable chip size, shape, and/or thickness. In some aspects, the thickness or height $H_S$ of solid state light emitter 56 is approximately 0.25 mm or more, 0.3 mm or more, 0.4 mm or more, or 0.5 mm or more.

In other aspects, and instead of being sprayed, phosphor P can be caused to settle or concentrate within a conformal layer over solid state light emitters 56, and within a predetermined bottom-most portion of filling material 48 for improving thermal management and sulfur resistance within apparatus 40.

Figure 8D:
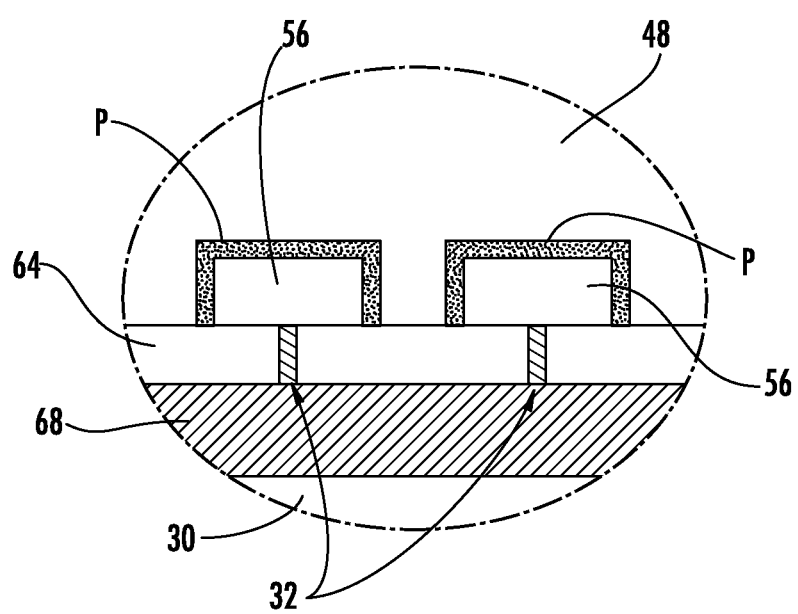

Referring to FIG. 8D and in some aspects, phosphor P can be provided over more than one surface of each solid state light emitter 56. In some aspects, phosphor P is provided over each surface of solid state light emitter 56. Phosphor P can be provided to solid state light emitters 56 prior to addition of a silicone filling material 48, thereby obviating the need for causing phosphor to settle and/or accumulate proximate a floor 64 of substrate 42. Thus, in some aspects, a phosphor P layer is visibly separate from a layer of filling material 48 that is devoid of phosphor. In other aspects, filling material 48 includes a variable and visibly distinct gradient (e.g., G, FIG. 8A) of phosphor P provided therein.

Figure 8E:
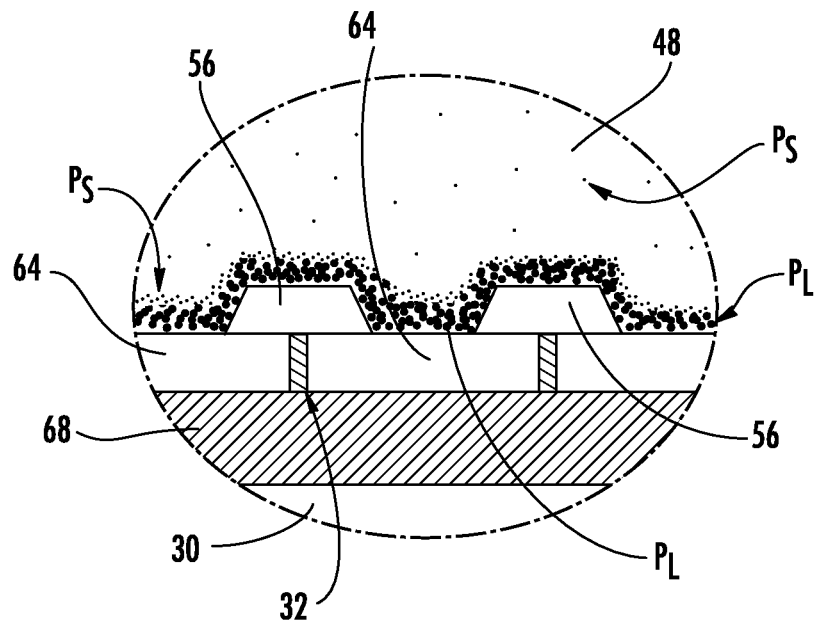

As FIG. 8E illustrates, more than one type, amount, and/or size of phosphor P can be provided within apparatus 40. In some aspects, larger phosphor particles $P_L$ can be used in addition to smaller phosphor particles $P_S$. In some aspects, the large and small phosphor particles $P_L$ and $P_S$, respectively, can be adapted to emit different wavelengths of light upon impingement of light from solid state light emitters 56. For example, $P_L$ can be configured to emit a first color of light and $P_S$ can be configured to emit a second, different color of light. In some aspects, only one type or color of phosphor P is provided in filling material 48. That is, $P_L$ can be configured to emit a first color of light and $P_S$ can also be configured to emit the same color of light, however, the phosphor particles can differ in size. That is, in some aspects, both $P_L$ and $P_S$ can comprise a same color (e.g., yellow, red, green, blue, etc.) of phosphor P but vary by size or diameter. In other aspects, at least two different types (e.g., material composition) and/or colors of phosphor P are provided in filling material 48. Providing three or more different types or colors of phosphor P is also contemplated. The type(s) and amount(s) of phosphor P can vary based upon the desired color point of apparatus 40. Phosphor particles $P_L$ and $P_s$ may be provided in separate portions and/or intermixed portions in some aspects. Apparatuses 40 can comprise phosphor P configured to emit light that is red, green, yellow, blue, white, and/or combinations thereof depending on a desired color point.

In some aspects, apparatus 40 is operable to produce a warm white (WW) color point of light that is at least 2700K, nominally 3000K, and up to 5000K CCTs, with 70-, 80-, and 90-CRI and above options. Cool white (CW) options are also contemplated herein.

As FIG. 8E illustrates, phosphor can be caused to settle or accumulate in one or more predetermined portions of filing material 48. In some aspects, larger phosphor particles $P_L$ can settle closest to the emission floor 64 surface of substrate 42. Smaller phosphor particles $P_S$ can settle over larger phosphor particles $P_L$ and further away from floor 64. Thus, in some aspects multiple layers of differently sized, shaped, and/or colors of phosphor P are provided a bottom portion of filling material 48 such that filling material is non-uniform. The layers of large and small phosphor particles $P_L$ and $P_S$, respectively, can run cooler and further prevent cracking of filling material 48 and further improve heat dissipation within apparatus 40. Resistance to sulfur degradation, color rendering, luminous flux, luminous flux density, color spread, and far field patterns can also be improved.

In some aspects, filling material 48 is intermixed with phosphor particles in each of the layers of smaller phosphor particles $P_S$ and larger phosphor particles $P_L$. In some aspects, filling material 48 comprises multiple layers over solid state light emitters, one of which can be predominantly a first type of phosphor (e.g., $P_L$) and encapsulant and a second layer which can be predominantly a second type of phosphor (e.g., $P_S$) and encapsulant. Phosphor particles $P_L$ and $P_S$ can comprise phosphor materials for converting light emitted by at least one solid state light emitter of the array of solid state light emitters to a peak wavelength in a red color, a yellow color, a green color, a blue color, a white color, or combinations thereof. In some aspects, a first layer of encapsulant and a predominantly red phosphor can be provided adjacent a second layer of encapsulant and a predominantly yellow phosphor. Dominant layers of phosphor particles of more than two types, colors, materials, sizes, and/or shapes can be provided.

In some aspects, not all of the phosphor P particles settle. As FIG. 8E illustrates, portions of filling material 48 may not be totally clear or devoid of phosphor, but instead still have some small particles of phosphor $P_S$ suspended therein. This can be desirable for maintaining a uniform color point and/or truer color rendering. In this example, most or a predominate portion of the small particles of phosphor $P_S$ have settled and are in the lower portion or layer of encapsulant 48 with the large particles of phosphor $P_L$, but there are still some unsettled small particles of phosphor $P_S$ in the upper layer or portion of encapsulant 48. The unsettled small particles of phosphor $P_S$ result in encapsulant 48 having a mix of at least two types of phosphor where at least one type of phosphor is predominantly in one layer or portion and another type of phosphor is predominantly in the at least one other layer or portion.

Figure 8F:
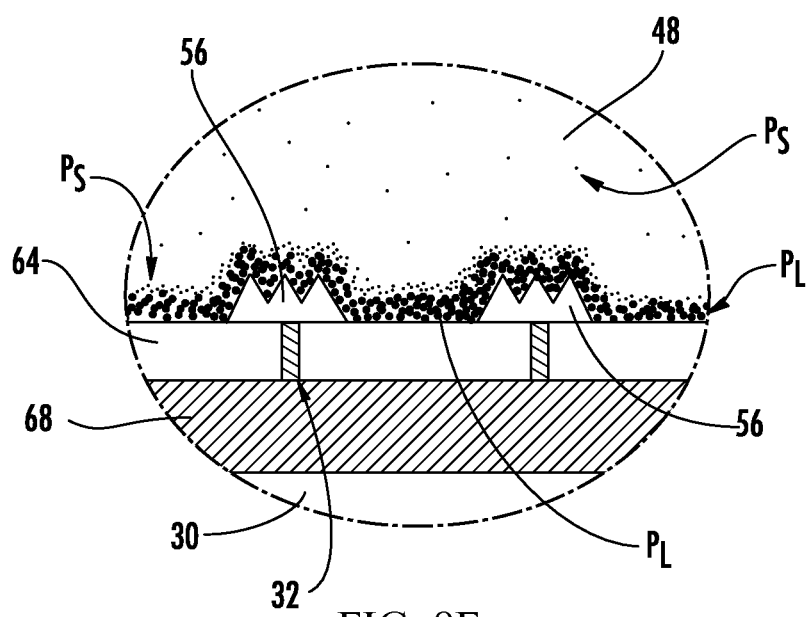

As FIG. 8F illustrates, more than one type of phosphor P and/or non-planar solid state light emitters 56 can be provided within an apparatus 40. As FIG. 8F illustrates, solid state light emitters 56 can comprise a non-planar upper surface. Notably, one or more layers or portions of encapsulant comprising phosphor P can be caused to settle and/or accumulate over each solid state light emitter 56 thereby conforming to the non-planar upper surface of solid state light emitters 56. Each layer or portion of encapsulant can comprise different amounts, particles sizes, and/or colors or types of phosphor. Different layers of encapsulant and predominantly red, green, yellow, blue, and/or white phosphors can be provided over each solid state light emitter 56.

In some aspects, only one layer or portion of encapsulant having settled phosphor P is provided over each solid state light emitter 56. In other aspects, two layers or portions of encapsulant having settled phosphor P are provided over each solid state light emitter 56. For example, filling material 48 can comprise encapsulant having a first portion of encapsulant and a second portion of encapsulant. The first portion of encapsulant can comprise both small phosphor particles $P_S$ and large phosphor particles $P_L$, although the first portion can be predominantly comprised of large phosphor particles $P_L$. The second portion of encapsulant can also comprise both small phosphor particles $P_S$ and large phosphor particles $P_L$, although the second portion can be predominantly comprised of small phosphor particles $P_S$. In other aspects however, the second encapsulant portion can comprise a layer in which the large phosphor particles $P_L$ have substantially completely settled. Thus, the second portion of encapsulant comprises small particles $P_S$ and is otherwise devoid of the first wavelength conversion material, or large phosphor particles $P_L$ (e.g., as in the upper portion of the filling material 48 as illustrated in 8F, and also moving towards light emission area 44 in FIG. 8A).

In some aspects, large and small phosphor particles $P_L$ and $P_S$, respectively, can only vary in particle size (e.g., diameter) but can be otherwise comprise a same shape, surface texture, coating, wear or attrition characteristic, propensity to electro-static charge, hardness, stiffness, strength, fracture toughness, and/or color. In other aspects, large and small phosphor particles $P_L$ and $P_S$, respectively, not only vary in particle size (e.g., diameter) but can also vary according to shape, surface texture, coating, wear or attrition characteristic, propensity to electro-static charge, hardness, stiffness, strength, fracture toughness, and/or color.

Figure 9:
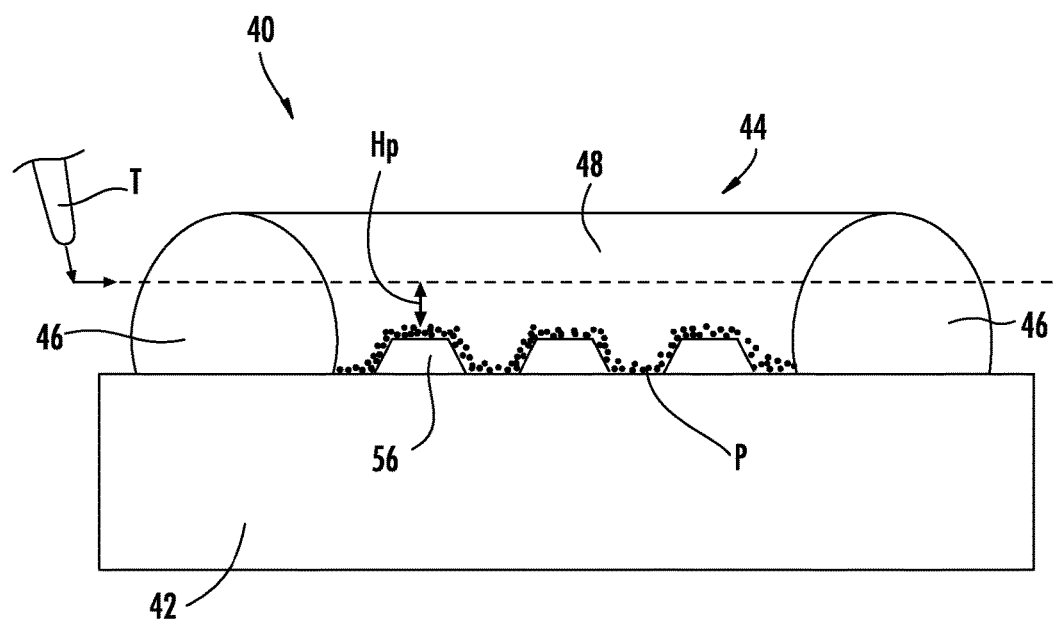
FIG. 9 is a sectional view associated with a method illustrating a solid state lighting apparatus comprising with a phosphoric filling material according to some aspects of the present subject matter.

FIG. 9 illustrates a method of providing apparatus 40 having a non-uniform dispersion or suspension of phosphor P described herein. As FIG. 9 illustrates, a high density array of closely packed solid stare light emitters 56 can be provided over a planar surface (e.g., emission floor 64) of substrate 42. An optional retention material 46 can be provided about solid state light emitters 56. Emission area 44 comprises solid state light emitters 56 and non-uniform filling material 48. A high luminous flux density of light (e.g., 30 lm/mm² or more) is emitted from light emission area 44 upon illumination of solid state light emitters 56. Settling phosphor P proximate the bottom of filling material 48 improves long term reliability at high luminous flux densities.

In some aspects, filling material 48 containing a predetermined amount of one or more types of phosphor P is provided over substrate 42. The phosphor P particles can be settled at a higher concentration within a portion of filling material 48, such as proximate floor of substrate 42 for improving heat dissipation through the substrate 42. Phosphor P can form a conformal layer over solid state light emitters 56 upon settling. In some aspects, a tool T can be applied to apparatus 40 for removing and/or planing material as indicated along the broken line for forming a smooth surface. In some aspects, portions of retention material 46 and/or filling material 48 are each reduced to substantially a same height, such that the amount of material between the phosphor $H_P$ layer and light emission area 44 is approximately 80 μm. Tool T can remove a portion of filling material 48 prior to or after filling layer 48 is cured.

In some aspects, tool T removes only silicone encapsulant (e.g., clear filling material 48) that is devoid of phosphor P. In some aspects, the entire clear region of filling material 48 can be removed. In further aspects, a small amount of residual phosphor P that may not settle within filling material 48, thus, a limited amount of phosphor P may also be removed via tool T.

Figure 10A:
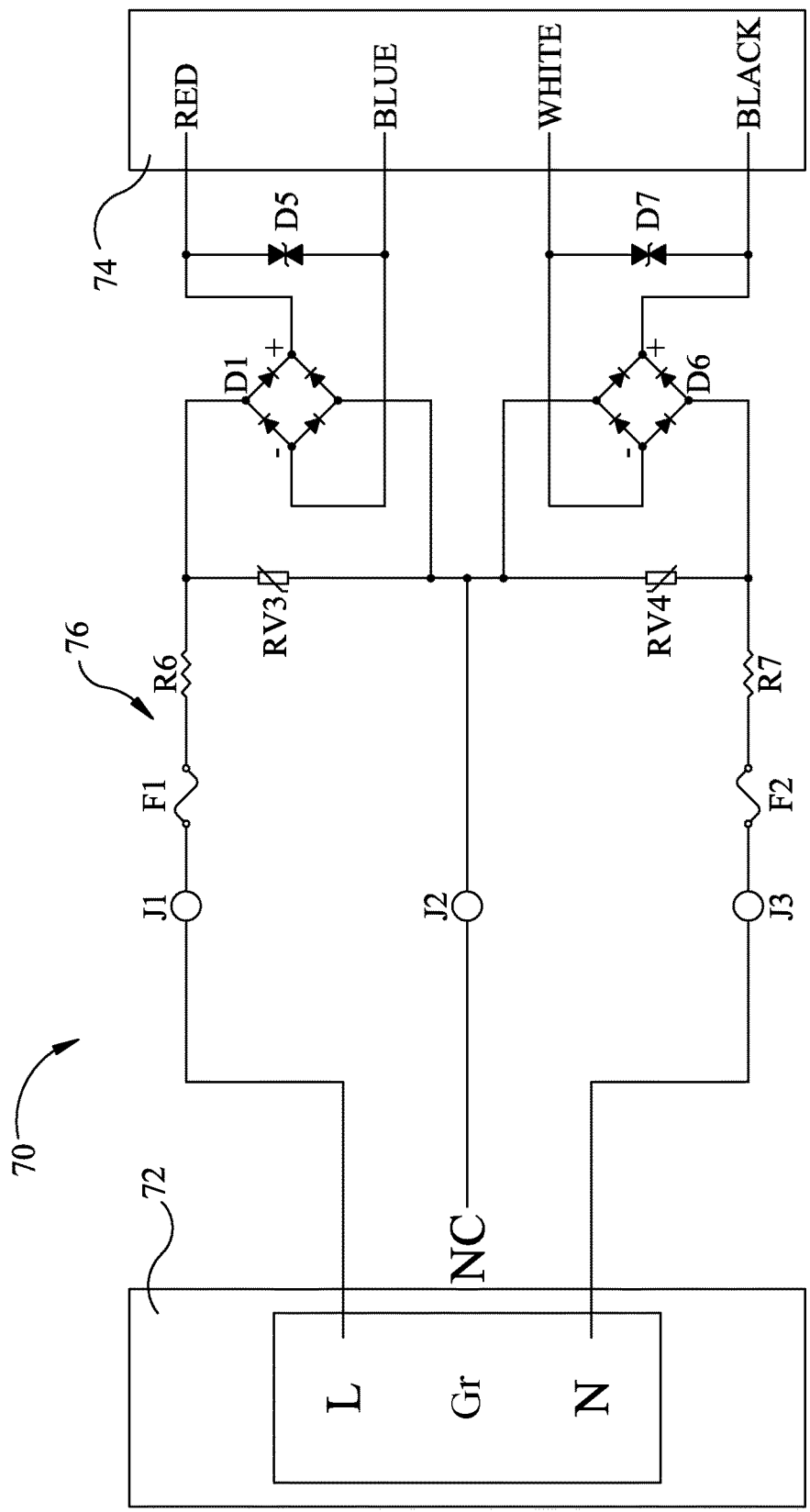
FIGS. 10A, 10B and 11 are exemplary schematic circuit diagrams illustrating operability of solid state lighting apparatuses at multiple different (e.g., user-defined) voltages according to some aspects of the present subject matter.
Figure 10B:
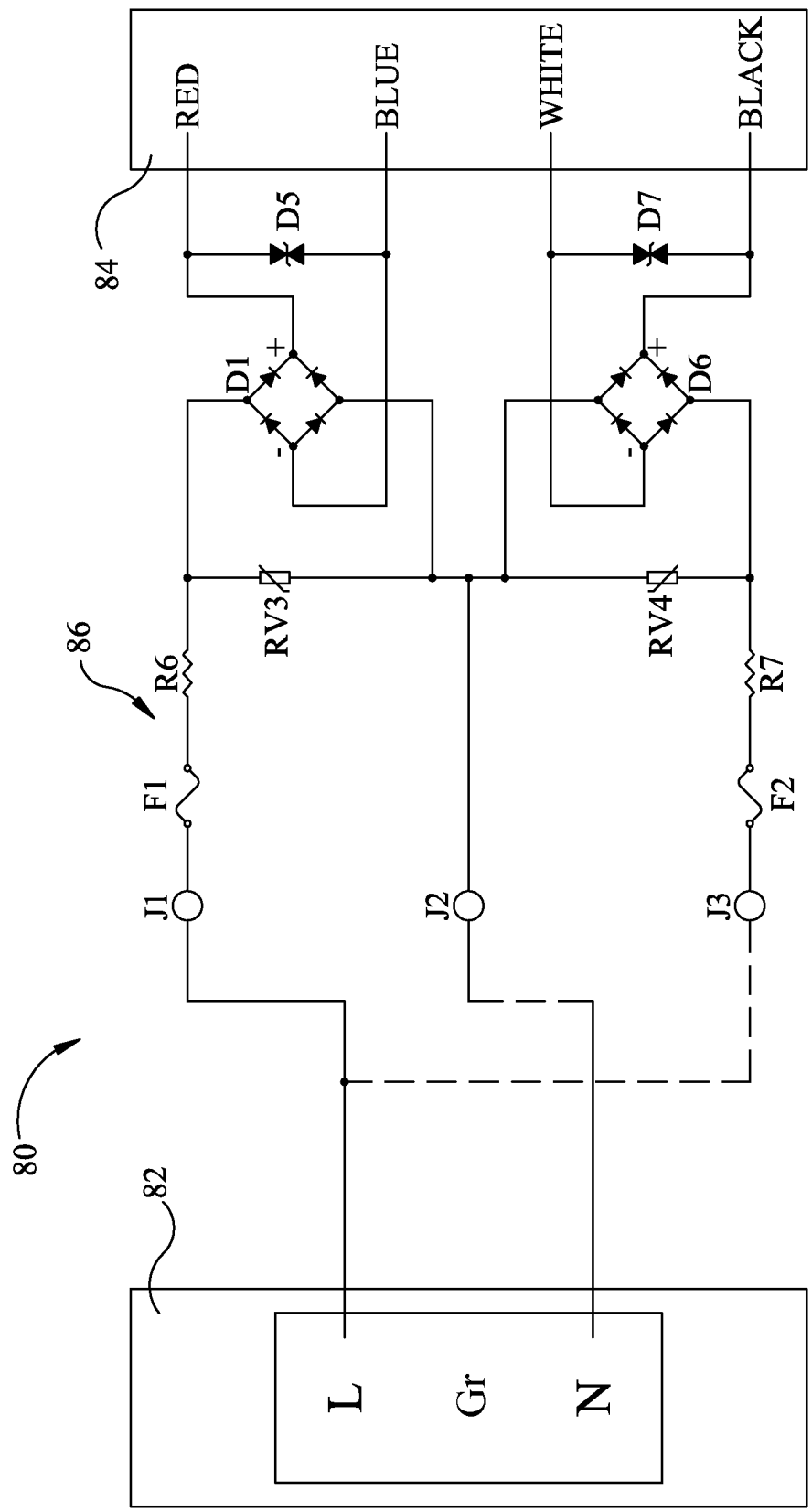

FIGS. 10A and 10B are schematic circuit diagrams illustrating solid state light emitter subsystems, in which the solid state lighting apparatuses are operable at multiple different (e.g., user-defined) voltages. Systems 70 and 80 are similar, with the exception of the wiring designated by broken lines in FIG. 10B. That is, system 80 is one variation of system 70, which illustrates operability of one apparatus at various voltages by varying connectivity of terminals (i.e., J1 to J3) to terminals (i.e., L and N).

Referring to FIG. 10A, a solid state light emitting system, generally designated 70, is shown. System 70 includes and/or works in conjunction with a user-provided AC line input or input device 72, and a voltage configurable solid state lighting apparatus 74 having four wired terminals, the wires being designated as RED, BLUE, WHITE, and BLACK. Similarly and referring to FIG. 10B, a solid state light emitting system, generally designated 80, is shown. System 80 includes and/or works in conjunction with a user-provided AC line input or input device 82, and a voltage configurable solid state lighting apparatus 84 having four wired terminals, the wires being designated as RED, BLUE, WHITE, and BLACK.

FIGS. 10A and 10B illustrate provision of a separate, intermediate circuit components 76 (FIG. 10A) and 86 (FIG. 10B) within each respective system, where the intermediate components 76 and 86 can be disposed between the AC line input (e.g., 72, 82) and the solid state lighting apparatus (e.g., 74, 84) for reducing the 4-wire selection of apparatus 74, 84 to a two wire selection of line L and neutral N. This allows operability of apparatus 74, 84 at either of two user-selected voltages. Note, FIGS. 10A and 10B illustrate a same circuitry subsystem, with the exception of the broken lines indicated in FIG. 10B, which illustrates connectivity of devices on one of two user-selected voltages, allowing a single device to be used in multiple different lighting applications and circuitry schemes. In FIG. 10A, terminal J2 is not connected as indicated by a non-connected NC line or state.

FIG. 10A illustrates an embodiment of a solid state lighting system 70 and apparatus 74 operable at approximately 240 V. FIG. 10B illustrates and embodiment of a solid state lighting system 80 and apparatus 84 operable at approximately 68 V.

In some aspects, user-defined circuitry component 72 and 82 comprises a plug, or a wired component adapted for connection to voltage configurable with solid state lighting apparatus 74, 84, which may comprise a socket. Customer defined portions 72 and 82 comprise access to a live or line wire L, a ground wire Gr, and a neutral wire N. Customer provided portions 72, 82 set or define the voltage to which voltage configurable apparatus 74, 84 must be able to adapt. This enables operability of the lighting apparatus in various countries, such as the United States, Canada, and Europe without modification.

As FIGS. 10A and 10B illustrate, intermediate circuits 76 and 86 comprise user-configurable or user-selectable circuits for rectifying AC current and providing surge protection and/or electrostatic discharge (ESD) protection during operation. According to some aspects, intermediate circuits 76 and 86 in FIGS. 10A and 10B plug into or otherwise connect with apparatus lines, or the RED, BLUE, WHITE, and BLACK lines. Intermediate circuits include transient voltage suppression (TVS) protection devices D5 and D7 per each pair of device lines (e.g., positive/negative pairs). Intermediate circuits and 76 and 86 can further comprise at least one rectifying circuit (e.g., a diode bridge) designated D1 and D6 per set of apparatus lines (e.g., RED/BLUE and WHITE/BLACK). Intermediate circuits and 76 and 86 can further comprise at least one surge protection element or surge protection circuitry, designated RV3 and RV4 in parallel with each diode bridge D1 and D6. Surge protection circuitry RV3 and RV4 can reduce or eliminate transmission of voltage transients exceeding the permissible limits to apparatus 74 or 84, each of which have solid state light emitters disposed thereon. Current can flow through one or more terminals J1 to J3 of the user defined circuit, and across one or more fuses F1, F2 and/or resistors R6, R7, which collectively work with the surge protection circuitry RV3 to RV4 to reduce the effects of surge events. End-users may provide terminals J1 to J3 by which the user can select a desired voltage and/or a series or parallel connection for the plurality of driving components within apparatus 74 or 84.

Customer provided portions 72 and 82 in FIGS. 10A and 10B can provide an alternating electrical signal (current and voltage) to apparatuses 74 and 84. In some aspects, AC voltage signal is directly provided to rectifier circuits D1 and D6, such as diode bridges. Diode bridges D1 and D6 provide a rectified AC voltage signal having a rectified (positive waveform). Power chips (e.g., 50A to 50C, FIG. 2) are adapted to switch the rectified signal through solid state light emitters, for example, by pushing more current into some segments and/or bypassing other segments via set/tap lines. In some aspects, solid state light emitters (56, FIG. 2) are activated and/or deactivated during different portions of an AC waveform. It can be appreciated that various aspects described herein can make use of the direct application of AC voltage to a lighting apparatus (e.g., from an outside power source, not shown) without the inclusion of an "on-board" switched mode power supply.

Figure 11:
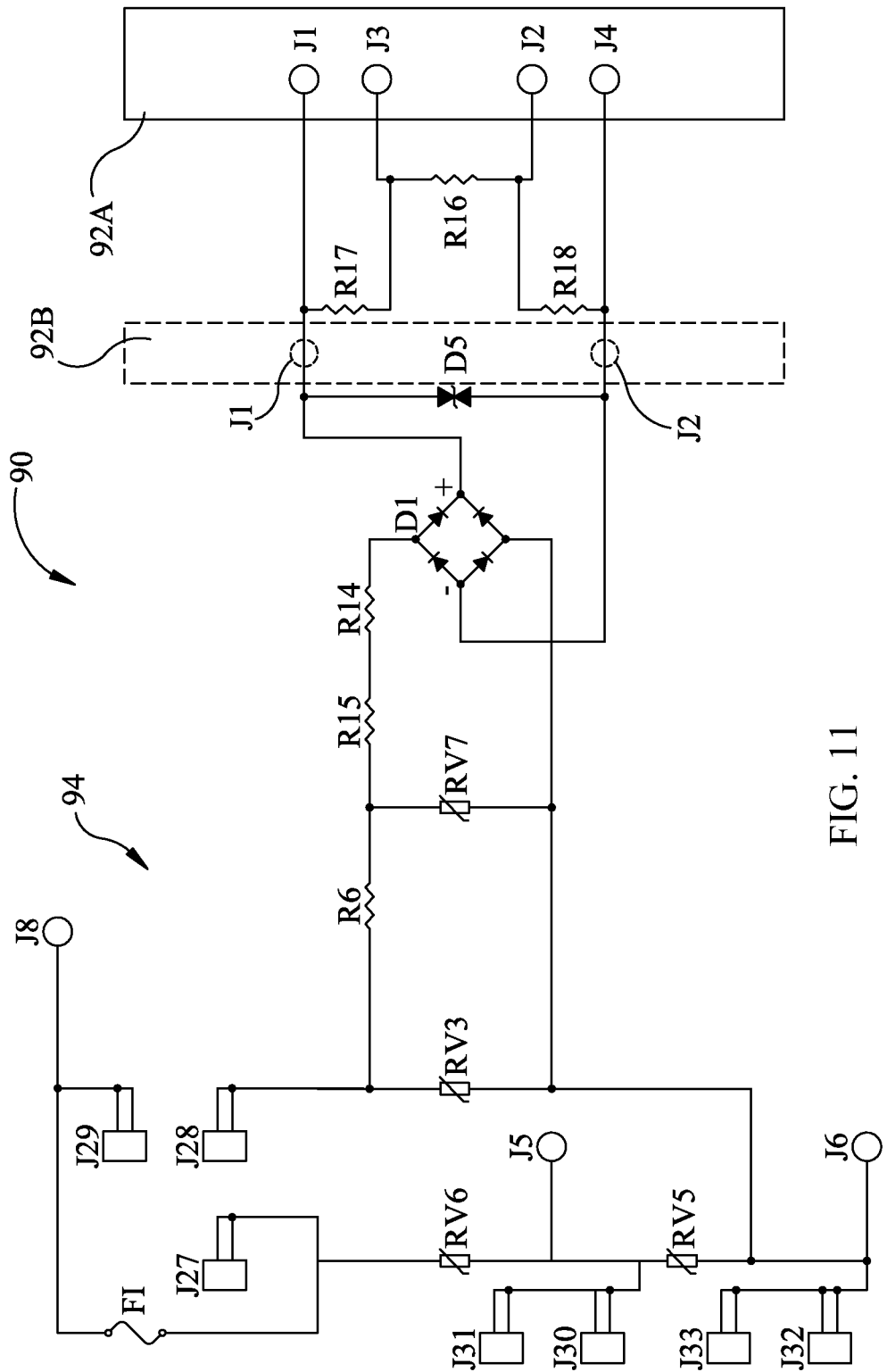

FIG. 11 is another embodiment of a solid state lighting system, generally designated 90, for user-selectable voltage. System 90 comprises a lighting apparatus 92A or 92B. Apparatus 92A comprises two lines or contacts or terminals J1 and J2. Apparatus 92A and terminals J1 and J2 are illustrated in broken lines to denote one optional and/or possible placement of the component terminals within the circuit. Apparatus 92B includes four lines (e.g., BLUE, BLACK, etc.) and four terminals (J1 to J4)comprising two sets of positive/negative terminals.

System 90 comprises a TVS protection device D5 and a rectifying circuit or rectifying bridge D1 for rectifying the AC current. TVS protection device D5 and bridge D1 can be disposed on a surface of apparatus (e.g., 92A, 92B), or over a separate board or substrate, where desired.

Surge protection can be provided by one or more electrical components, designated RV3, RV5, RV6 and RV7 for eliminating transmission of voltage transients exceeding the line voltage. Resistors R14 and R15 can provide surge protection or jumpers. Resistors R16, R17, R18 can be used to selectee voltage in conjunction with one or more fuses F1. System 94 can be operable at any voltage, such as any line voltage supplied via system terminals J27 to J32. Table 3 below illustrates two possible configurations for system 90 in FIG. 11.

TABLE

| CONFIGURATION | R16 | R17 | R18 |
|---|---|---|---|
| LOW VOLTAGE, 68 V | OPEN | SHORT | SHORT |
| HIGH VOLTAGE, 240 V | SHORT | OPEN | OPEN |

In Table 3 above, the term "short" indicates that the resistor is providing zero resistance (Le., zero Ohms) and "open" indicates that the resistance is infinite (i.e., infinite Ohms).

Figure 12:
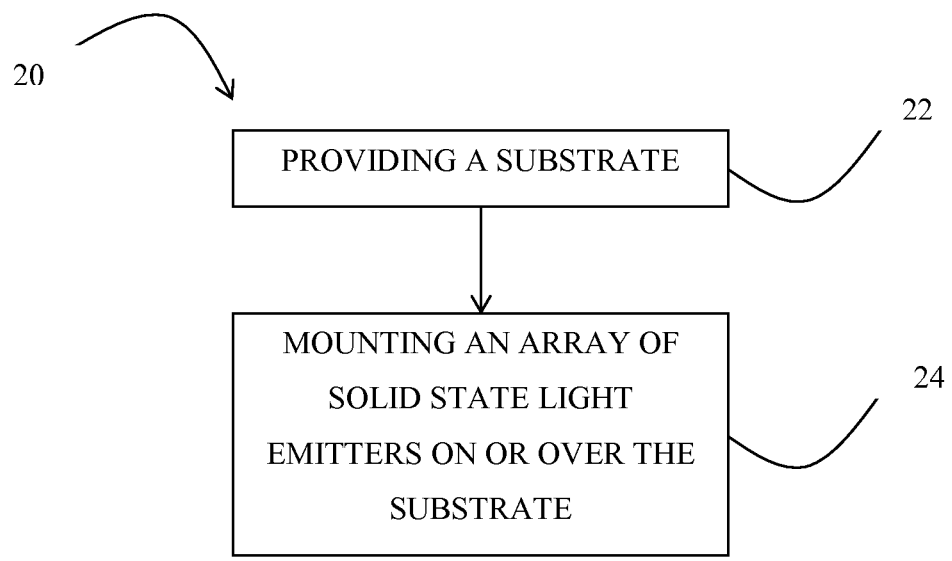
FIG. 12 is an exemplary process flow diagram illustrating a method of providing a solid state lighting apparatus according to some aspects of the present subject matter.

FIG. 12 illustrates an exemplary flow diagram for a method of providing a solid state lighting apparatus 40, the method generally being designated 20. In a providing step, designated 22, a substrate 42 can be provided. In a mounting step, designated 24, an array of solid state light emitters 56 can be non-uniformly mounted on or over substrate 42 such that a predetermined group of solid state light emitters 56 can result in reduction of hot spots.

Systems, apparatuses, and/or related methods herein are voltage configurable and can accommodate any desired voltage level and different voltage levels for different applications. For illustration purposes, apparatus and systems herein are operable at both 68V and 240V. Solid state light emitters and/or segments are configured to be activated "on" and/or deactivated "off" via switching at different times relative to one another during a portion of an AC cycle, and are configured to operate within about 3 percent or more of a root mean square (RMS) voltage of the AC power source (e.g., "AC line in"). In certain aspects, the AC power source has a nominal RMS voltage of at least about 100V, such as including approximate values of 90V, 40V, 68V, 170V, 220V, 230V, 240V, 277V, 300V, 480V, 600V higher voltages, or any approximate or subset of voltage. Apparatuses and systems herein are operable at customer-provided voltage levels, where desired, and can be operable at a same or different voltage levels depending upon the number and/or wired configuration (e.g., series/parallel connections) of drive components, such as power chips. In some aspects, the voltage at which the collective solid state light emitters or segments operate can add up or sum to a line voltage of a user defined circuit.

Apparatuses, systems, and/or related herein can deliver approximately 90 LPW or more in select color temperatures, such as between approximately 1800K and 3000K nominally 2700K). In other aspects, apparatuses, systems, and/or related methods herein can deliver approximately 90 LPW between approximately 5700K and 4000K, which may not be specifically used for and/or designed for dimmable applications. In some aspects, apparatuses, systems, and/or related methods herein target a color temperature of between approximately 1800K and 6000K. In some aspects, substrate of apparatuses herein can comprise a form factor suitable for drop-in or plug-in replacement of standard light bulbs, elongated fluorescent tube-type bulbs, or replacement of fluorescent light fixtures.

Aspects as disclosed herein can provide one or more of the following beneficial technical effects: improved dissipation of heat (and concomitant improvement of operating life) of solid state lighting apparatuses operated with AC power; drop-in or plug-in apparatuses; voltage configurable apparatuses; selectively configurable apparatuses; reduced cost of solid state lighting apparatuses; reduced size or volume of solid state lighting apparatuses; reduced perceptibility of flicker of solid state lighting apparatuses operated with AC power; reduced perceptibility of variation in intensity (e.g., with respect to area and/or direction) of light output by solid state lighting apparatuses operated with AC power; reduced perceptibility of variation (e.g., with respect to area and/or direction) in output color and/or output color temperature of light output by solid state lighting apparatuses operated with AC power; improved manufacturability of solid state lighting apparatuses operated with AC power; improved ability to vary color temperature of emissions of solid state lighting apparatuses operated with AC power; improved light extraction; reduced absorption of light by driver circuitry components; and reduced impingement of light upon driver circuitry or electrical components of a solid state lighting apparatus.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A solid state lighting apparatus, comprising:
a substrate;
solid state light emitters arranged on or over the substrate, the solid state light emitters being arranged in strings of light emitters;
a plurality of driving components arranged on or over the substrate, each driving component being configured to control at least two strings of light emitters,
wherein the strings of light emitters are arranged in an array of solid state light emitters,
wherein a first string of the at least two strings of light emitters for each driving component is configured to consume more total power and more power per solid state light emitter than a second string of the at least two strings of light emitters for each driving component,
wherein each driving component is configured to independently activate and deactivate the first string associated therewith during a portion of an alternating current (AC) cycle, such that each first string is not activated during a same portion of the AC cycle as any other first string, and
wherein the solid state light emitters of each first string are non-uniformly spaced apart from each other.

2. The solid state lighting apparatus of claim 1, wherein each of the plurality of driving components is configured to independently activate the first string less than the second string, such that each solid state light emitter in the first string operates less than, or emits less light than, solid state light emitters in the second string.

3. The solid state lighting apparatus of claim 2, wherein the first string associated with each driving component is disposed in, around, or extending towards a center of a light emission area disposed over the substrate.

4. The solid state lighting apparatus of claim 2, wherein the first string associated with each driving component is disposed around a periphery of a light emission area disposed over the substrate.

5. The solid state lighting apparatus of claim 1, comprising a light emission area, which is disposed over the substrate and comprises the array of solid state light emitters, wherein a central portion of the light emission area has a lower die density than a peripheral portion of the light emission area.

6. The solid state lighting apparatus of claim 5, wherein the array of solid state light emitters is spaced apart such that each solid state light emitter disposed around or near the central portion of the light emission area has a non-uniform spacing compared to other solid state light emitters in the array.

7. The solid state lighting apparatus of claim 6, wherein each solid state light emitter disposed around or near the central portion of the light emission area is spaced apart from another solid state light emitter disposed around or near the central portion of the light emission area by between approximately 200 μm and 400 μm.

8. The solid state lighting apparatus of claim 5, wherein the solid state light emitters are spaced apart such that at least a portion of the central portion of the light emission area is devoid of solid state light emitters.

9. The solid state lighting apparatus of claim 5, wherein the solid state light emitters are spaced apart such that, relative to a width of the central portion of the light emission area, at least one row of solid state light emitters has a non-uniform spacing compared to other solid state light emitters in the array.

10. The solid state lighting apparatus of claim 5, wherein one or more first string is disposed proximate to the peripheral portion of the light emission area, solid state light emitters in the one or more first string being configured to generate more heat than solid state light emitters in the second strings.

11. The solid state lighting apparatus of claim 1, wherein one or more first string is configured such that the solid state light emitters thereof are spaced further apart than solid state light emitters in the second string.

12. The solid state lighting apparatus of claim 1, comprising a phosphoric filling material disposed over the solid state light emitters, wherein a layer of phosphor within the filling material settles to, or is otherwise proximate to, a bottom of the phosphoric filling material.

13. A method of providing a solid state lighting apparatus, the method comprising:
providing a substrate;
mounting solid state light emitters on or over the substrate to form strings of light emitters that are arranged in an array of solid state light emitters;
arranging a plurality of driving components on or over the substrate;
wherein each driving component controls at least two strings of light emitters;
wherein a first string of the at least two strings of light emitters for each driving component consumes more total power and more power per solid state light emitter than a second string of the at least two strings of light emitters for each driving component,
wherein each driving component independently activates and deactivates the first string associated therewith during a portion of an alternating current (AC) cycle, such that each first string is not activated during a same portion of the AC cycle as any other first string, and
wherein the solid state light emitters of the each first string are non-uniformly spaced apart from each other.

14. The method of claim 13, wherein each of the plurality of driving components independently activates the first string less than the second string, such that each solid state light emitter in the first string operates less than, or emits less light than, solid state light emitters in the second string.

15. The method of claim 14, comprising consuming, with at least one first string, a higher total power and power per solid state light emitter than the second strings, wherein the at least one first string is disposed in, around, or extending towards a center of a light emission area disposed over the substrate.

16. The method of claim 13, comprising defining a light emission area disposed over the substrate, wherein a central portion of the light emission area has a lower die density than a peripheral portion of the light emission area.

17. The method of claim 16, wherein mounting the solid state light emitters on or over the substrate comprises spacing the solid state light emitters apart, such that each solid state light emitter disposed around or near the central portion of the light emission area has a non-uniform spacing compared to other solid state light emitters in the array.

18. The method of claim 16, wherein mounting the solid state light emitters on or over the substrate comprises arranging one or more first string proximate to the peripheral portion of the light emission area, solid state light emitters in the one or more first string emitting more heat than solid state light emitters in the second strings.

19. A solid state lighting system, comprising:
a substrate;
solid state light emitters arranged on or over the substrate, wherein the solid state light emitters are arranged in strings of light emitters to form an array of solid state light emitters;
a plurality of driving components arranged on or over the substrate, each driving component being configured to control at least two strings of light emitters; and
a light emission area comprising the array of solid state light emitters, wherein the light emission area is disposed over the substrate, and wherein a central portion of the light emission area has a lower die density than a peripheral portion of the light emission area,
wherein a first string of the at least two strings of light emitters for each driving component are configured to consume more total power and more power per solid state light emitter than a second string of the at least two strings of light emitters for each driving component, and
wherein the plurality of driving components are each configured to independently activate and deactivate the first string associated therewith during a portion of an alternating current (AC) cycle, such that each first string is not activated during a same portion of the AC cycle as any other first string.

20. The solid state lighting system of claim 19, wherein the solid state light emitters are spaced apart from each other such that each solid state light emitter disposed around or near the central portion of the light emission area has a non-uniform spacing compared to other solid state light emitters in the array.

21. The solid state lighting system of claim 19, wherein the solid state light emitters of each first string has a non-uniform spacing from the solid state light emitters of each second string.

* * * * *